(12) United States Patent
Yoshida et al.

(10) Patent No.: US 9,031,817 B2
(45) Date of Patent: May 12, 2015

(54) METHOD FOR DESIGNING A NATURAL LAMINAR FLOW WING OF A SUPERSONIC AIRCRAFT

(75) Inventors: Kenji Yoshida, Tokyo (JP); Kisa Matsushima, Tokyo (JP); Yoshine Ueda, Tokyo (JP); Hiroaki Ishikawa, Tokyo (JP)

(73) Assignee: Japan Aerospace Exploration Agency, Tokyo (JP)

( * ) Notice: Subject to any disclaimer, the term of this patent is extended or adjusted under 35 U.S.C. 154(b) by 544 days.

(21) Appl. No.: 13/325,742

(22) Filed: Dec. 14, 2011

(65) Prior Publication Data

US 2012/0166148 A1 Jun. 28, 2012

(30) Foreign Application Priority Data

Dec. 14, 2010 (JP) ................................. 2010-278021

(51) Int. Cl.
*G06F 17/50* (2006.01)
*B64C 3/14* (2006.01)
*B64F 5/00* (2006.01)
*B64C 30/00* (2006.01)

(52) U.S. Cl.
CPC .............. *B64C 3/14* (2013.01); *G06F 17/5095* (2013.01); *B64C 2003/149* (2013.01); *B64F 5/00* (2013.01); *Y02T 50/12* (2013.01); *B64C 30/00* (2013.01)

(58) Field of Classification Search
CPC ............ G06F 17/5004; G06F 17/5018; G06F 17/5095; B64C 3/14; B64C 2003/149; B64C 5/00; B64C 30/00; Y02T 50/12
USPC ........................ 703/1, 2, 7, 8; 244/45 R, 35 R
See application file for complete search history.

(56) References Cited

PUBLICATIONS

Kwak, Dong-Youn et al., "Validation of Aerodynamic Design Technology of Supersonic Experimental Airplane (NEXST-1) by Flight Test", Nov. 19-22, 2007, West-East High Speed Flow Field Conference.*
Tokugawa, Naoko et al., "Transition Measurement System of Experimental Supersonic Transport NEXST-1", 2006, 25th International Congress of the Aeronautical Sciences, ICAS.*
Ishikawa, Hiroaki et al., "CFD Analysis on Flight Test Results of Supersonic Experimental Airplane NEXST-1", 2007, AIAA.*
Yoshida, Kenji, "Supersonic Drag Reduction Technology in the Scaled Supersonic Experimental Airplane Project by JAXA", Aug. 8, 2009, Progress in Aerospace Sciences 45, Elsevier Ltd.*
Braslow, Albert L. et al., Simplified Method for Determination of Critical Height of Distributed Roughness Particles for Boundary-Layer Transition at Mach Numbers from 0 to 5, Sep. 1958, NACA.*

(Continued)

*Primary Examiner* — Kamini S Shah
*Assistant Examiner* — Cedric D Johnson
(74) *Attorney, Agent, or Firm* — Westerman, Hattori, Daniels & Adrian, LLP

(57) ABSTRACT

In designing supersonic aircrafts, a method of designing a natural laminar flow wing is provided which reduces friction drag by delaying boundary layer transition under flight conditions of actual aircrafts. A target Cp distribution on wing upper surface, suited to natural laminarization in which boundary layer transition is delayed rearward in desired Reynolds number states, is defined by a functional type having as coefficients parameters depending on each spanwise station, a sensitivity analysis employing a transition analysis method is applied to the parameters, and a search is performed for the optimum combination of parameters to delay transition rearward.

9 Claims, 19 Drawing Sheets

(56) References Cited

PUBLICATIONS

Joslin, Ronald D., "Aircraft Laminar Flow Control", 1998, Annual Rev. Fluid Mech., 30.*

Kroo, I. et al., "Natural Laminar Flow for Quiet Efficient Supersonic Aircraft", 2002, AIAA-2002-0416.

Ueda, Y., "Numerical Study on Optimum Pressure Distribution for Supersonic Natural Laminar Flow Wing Desgin", Proc. 32nd Fluid Dynamics Conference, 2000, w/English Abstract.

Yoshida, K et al., "Aerodynamic Design of Unmanned and Scaled Supersonic Experimental Airplane in Japan", ECCOMAS, 2004.

Yoshida, K. et al., "Flight Test Results of Supersonic Experimental Airplane (NEXST-1), Nagare," Journal of Japan Society of Fluid Mechanics, 2006, pp. 321-328, vol. 25.

Yoshida, K., "On fundamental research regarding aerodynamic shape of supersonic transports: an example of in-house research results", Journal of the Japan Society for Aeronautical and Space Sciences, 1994, pp. 1-13, vol. 42, No. 486.

Yoshida, K. et al., "Overview of NAL's Program Including the Aerodynamic Design of the Scaled Supersonic Experimental Airplane", Fluid Dynamics Research on Supersonic Aircraft of VKI, ROT Educational Notes 4, 1998.

Yoshida, K. et al., "Reconsideration on Aerodynamic Design Concepts of the Scaled Supersonic Experimental Airplane Comparison of the 1st Generation SST-", 31st Annual Conference of the Japan Society for Aeronautical and Space Sciences, 2000, w/English Abstract.

Yoshida, K. et al., "Supersonic drag reduction technology in the scaled supersonic experimental airplane project by JAXA", Progress in Aerospace Sciences, 2009, pp. 126-146, vol. 45, No. 4-5.

* cited by examiner

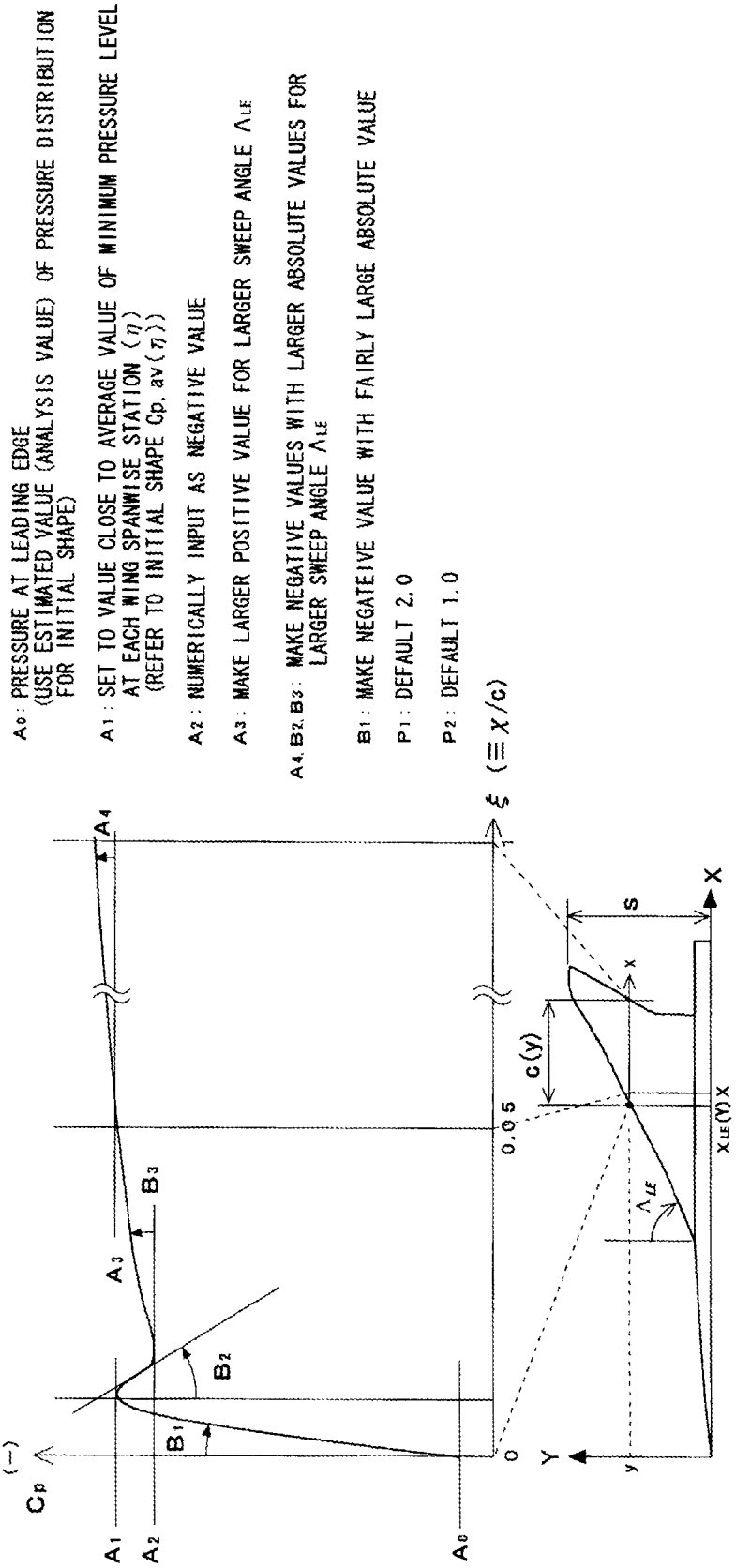

$$Cp(\xi,\eta) = \sum_{n=0}^{4} A_n(\eta) f_n(\xi,\eta)$$

where $f_0(\xi,\eta) \equiv 1$ $f_1(\xi,\eta) \equiv e^{B_1(\eta)\xi} - 1$ $f_2(\xi,\eta) \equiv e^{B_2(\eta)\xi} - 1$ $f_3(\xi,\eta) \equiv e^{B_3(\eta)\xi^{P_1}} - 1$ $f_4(\xi,\eta) \equiv \xi^{P_2}$ where $\xi \equiv \dfrac{x}{c(y)} = \dfrac{X - X_{LE}(Y)}{c(Y)}$ , $\eta \equiv \dfrac{y}{s} = \dfrac{Y}{s}$

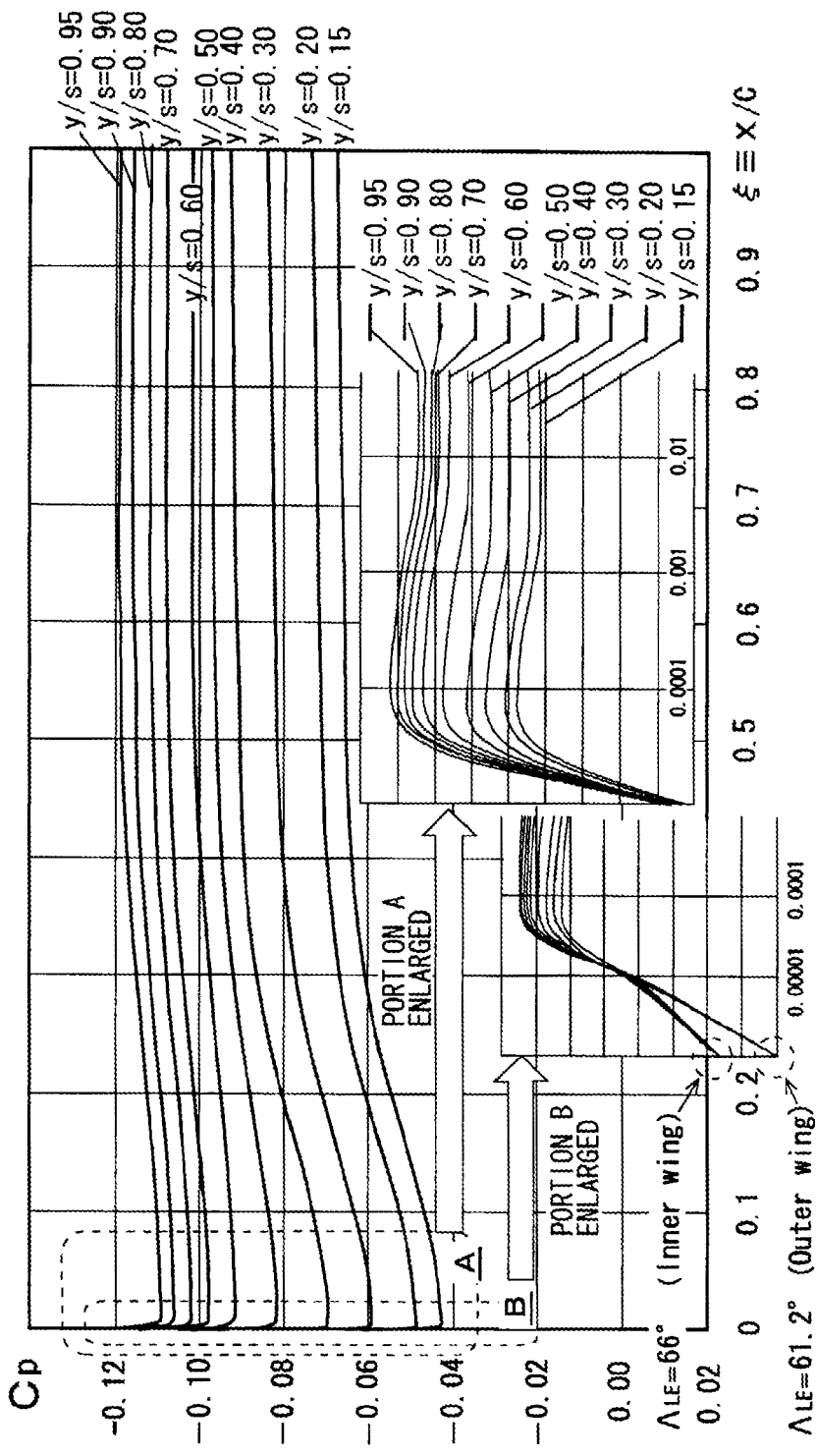

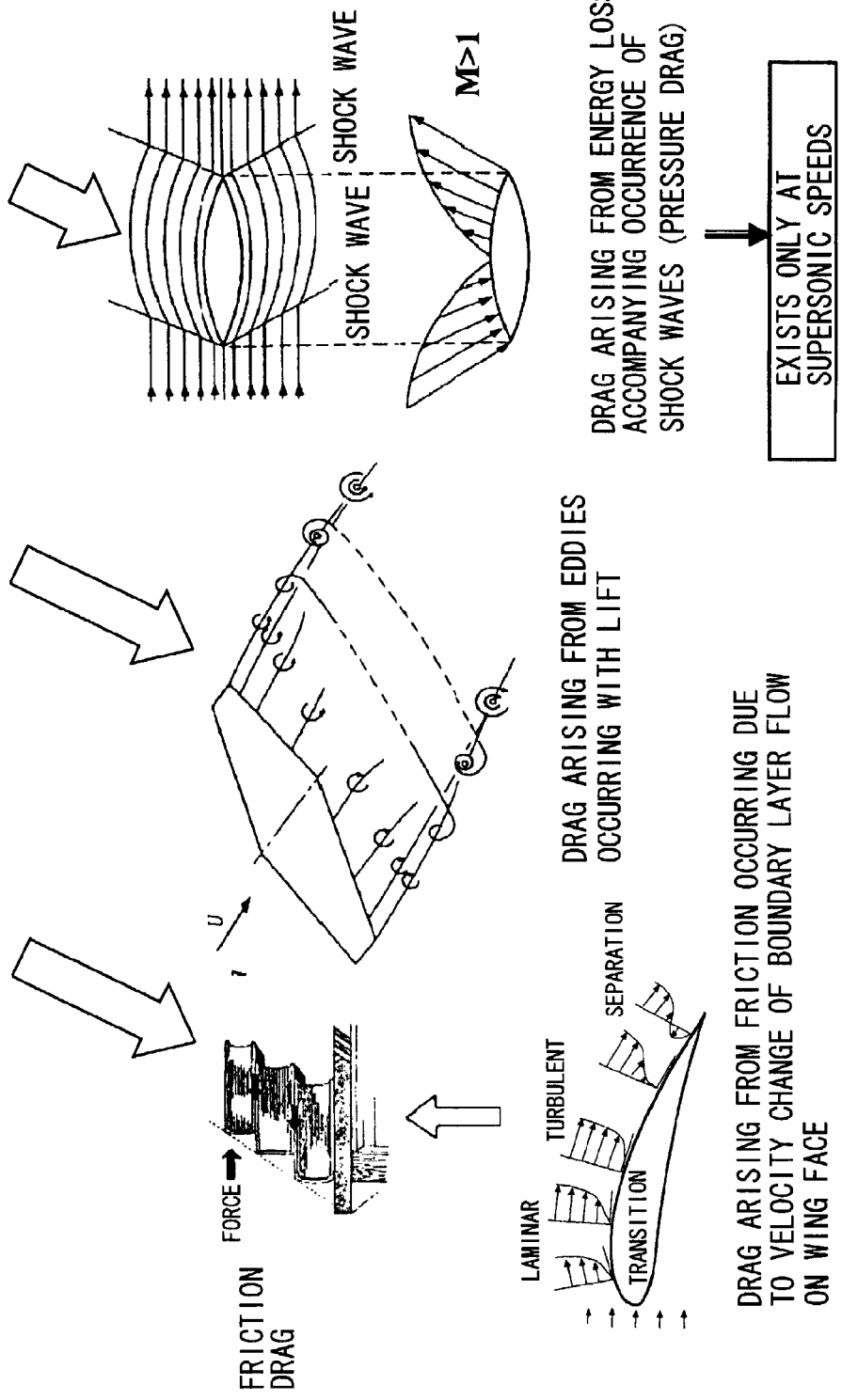

Fig. 10 Prior Art
[PROPOSAL FOR SUPPRESSING INSTABILITY OF 3D BOUNDARY LAYER]
(1) TOLLMIEN-SCHLICHTING (T-S) INSTABILITY
 ⇒ ACCELERATING GRADIENT
(2) CROSS-FLOW (C-F) INSTABILITY
 ⇒ SHORTEN ACCELERATION REGION
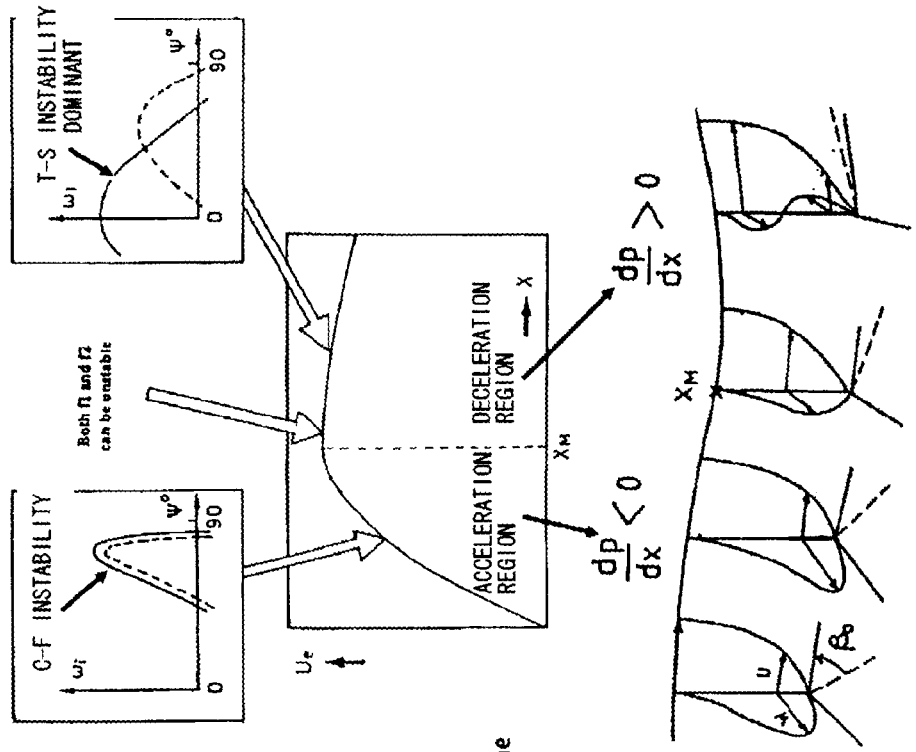
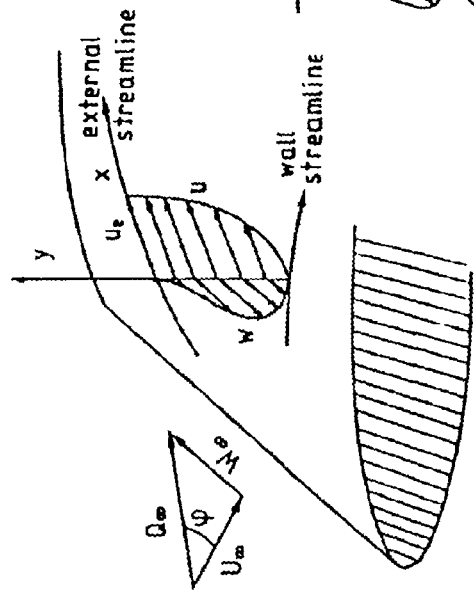
Ref. AGARD Rep. 793

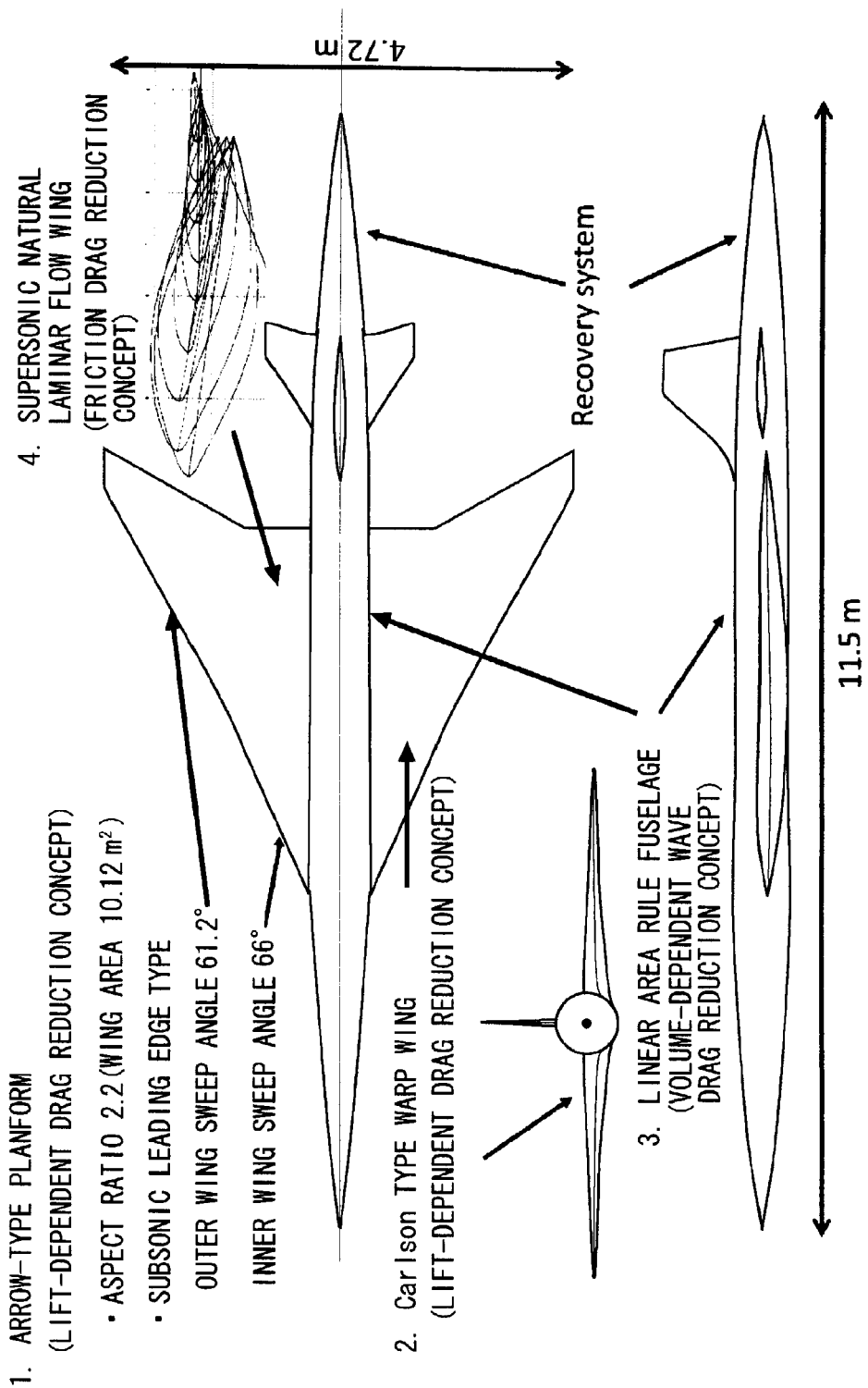

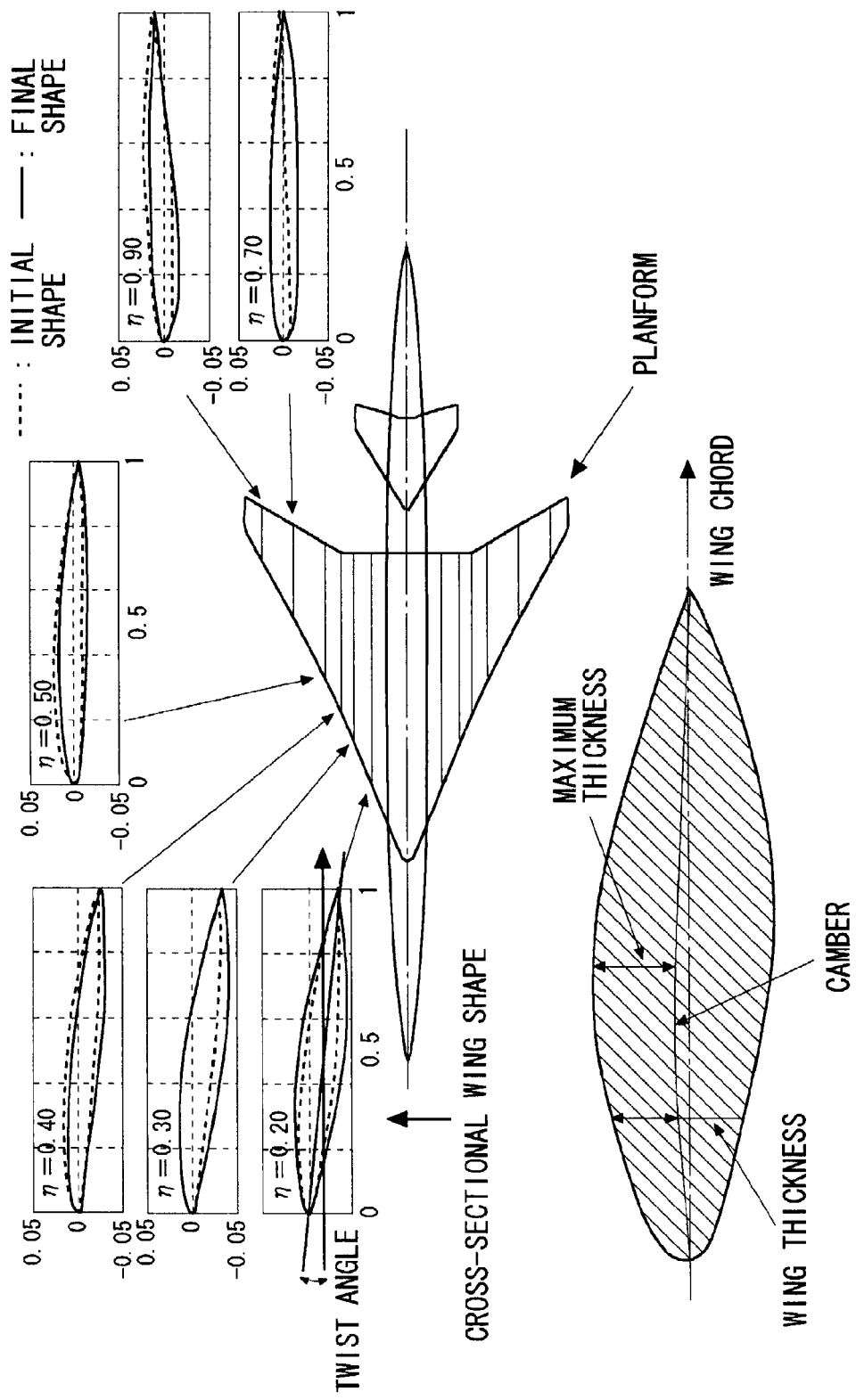

METHOD FOR DESIGNING A NATURAL LAMINAR FLOW WING OF A SUPERSONIC AIRCRAFT

BACKGROUND OF THE INVENTION

1. Field of the Invention

This invention relates to a method of designing a natural laminar flow wing of an actual supersonic aircraft, and in particular relates to a method of designing a natural laminar flow wing which, in addition to reduction of pressure drag, which has been a goal in the past in design of a supersonic aircraft, reduces friction drag by delaying the boundary layer transition at the wing surface in flight conditions similar to those of an actual aircraft (high Reynolds-number state) and enables significant improvement in the lift-drag ratio.

2. Description of the Related Art

In addition to normal lift-dependent drag and friction drag, a supersonic aircraft differs from a subsonic aircraft in that wave drag, arising from the occurrence of shock waves based on the compressibility of air, is further added (see FIG. 8), so that the lift-drag ratio (=lift/drag), which is an index of economic efficiency, is reduced. The Concorde, which has been the only commercial supersonic transport (SST) aircraft, has been plagued with problems of economic efficiency and environmental acceptability due to engine noise and sonic boom. Comparing the Boeing 747, which is representative of subsonic aircraft, and the Concorde, the lift-drag ratios of the two are approximately 14 and 7 respectively, and in development of a next-generation SST further improvement of this lift-drag ratio of 7 will be sought in order to improve economic efficiency (see K. Yoshida, "On fundamental research regarding aerodynamic shape of supersonic transports: an example of in-house research results", Journal of The Japan Society For Aeronautical and Space Sciences, Vol. 42, No. 486 (1994), pp. I-13, and K. Yoshida, K. Suzuki, T. Iwamiya and F. Kuroda, "Reconsideration on Aerodynamic Design Concepts of the Scaled Supersonic Experimental Airplane—Comparison of the 1st Generation SST—", 31st Annual Conference of the Japan Society for Aeronautical and Space Sciences, 2000).

In optimal aerodynamic design methods using computational fluid dynamics (Hereafter, it is abbreviated as CFD) which have been developed in recent years, attempts at design have been made which focus on reduction of pressure drag, of which the above-described wave drag is representative, and significant progress has been made compared with the era of Concorde development (see K. Yoshida, "Supersonic drag reduction technology in the scaled supersonic experimental airplane project by JAXA", Progress in Aerospace Sciences, Vol. 45, No. 4-5, pp. 124-146 (2009)). A combination of CFD with a design method employing numerically optimized algorithms is thought to be in a stage capable of derivation of substantively optimal solutions within the range of various constraints on computing capacity and design (meaning constraints arising from such limitations as are imposed by structural design, equipment design, flight characteristics, and similar). Hence when further improvement is sought, rather than pressure drag, it is thought to be essential to attempt to reduce friction drag, which has not been examined for the design of actual supersonic aircraft to date. It is also here noted that this invention relates to reduction of friction drag.

In general, friction drag occurs based on the following physical mechanism. First, because air is viscous, the airflow velocity in very close proximity to the surface of an airframe is substantially the same as that on the surface, but in the normal direction from the surface the velocity increases sharply from zero to a velocity close to uniform flow, and consequently the velocity gradient in the normal direction in proximity to the airframe surface is extremely high. According to aerodynamics, the friction force exerted by air on an airframe surface is the product of this velocity gradient and the coefficient of viscosity of air. Hence the aim (principal object of design) of reducing the friction force acting on the airframe consists of reducing this coefficient of viscosity or the velocity gradient. The former is an aerodynamic physical constant, and so artificial control is difficult. Hence the principal object of design is to reduce the latter, the velocity gradient, in order to reduce friction drag.

Next, as general properties of the boundary layer, it is known that in the front portion of the airframe surface, comparatively stable laminar flow is maintained (this is called the laminar boundary layer), and that with rearward flow, this laminar flow collapses, changing to a spatially and temporally turbulent flow condition (this is called the turbulent boundary layer). This change is called the boundary layer transition. The phenomenon of boundary layer transition occurs through a process in which extremely slight disturbances included in the airflow are amplified within the laminar boundary layer extending to above a physical object, and induce nonstationary and spatially irregular fluctuations within the boundary layer (see FIG. 9). This property of amplification and attenuation of disturbances within the laminar boundary layer is called instability of the boundary layer; it is known that in general there exist two instability mechanisms (see FIG. 10). One is an instability wave arising from a transient distribution having an axis perpendicular to the direction of flow arising at a two-dimensional wing. This is normally called the Tollmien-Schlichting wave (T-S wave) in honor of the theoretical discoverers. So this instability is called the Tollmien-Schlichting instability (T-S instability).

The other is instability arising from velocity components within the boundary layer induced by a pressure gradient in the direction perpendicular to the direction of flow occurring on a three-dimensional swept wing. This is thought to correspond to a transient distribution having an axis in the flow direction. This flow is normally called "crossflow", and so this instability is called the crossflow instability (C-F instability).

It is known that in the turbulent boundary layer which occurs through this boundary layer transition, due to the influence of unsteady and spatially irregular turbulence, the velocity at places only slightly removed from the wall face at which velocity is zero is greatly amplified, and the velocity gradient is much larger than in the laminar boundary layer, so that consequently the friction coefficient is approximately 7 times greater than for the laminar boundary layer, inducing a sharp increase in friction drag. Hence conceivable techniques for reducing friction drag are to introduce innovations into the shape of the object (the wing shape) so as to delay this boundary layer transition to as far downstream (rearward) as possible, or so as to artificially control the flow. In the former technique, a design innovation in the wing shape is employed; because the aim is a natural laminar flow achieved through the pressure distribution theresurrounding, this technique is called natural laminarization; in the latter technique active control of the boundary layer, such as through suction and venting, is performed, and so this technique is called laminar flow control.

This invention, described below, has as a principal object effective natural laminarization, which among this is most effective and is beneficial with respect to energy efficiency, and relates to a new design method which, in conventional supersonic aircraft designed with the goal of reducing pressure drag, enables natural laminarization of the main wing in order to enable further reduction of friction drag. In 1998 there had been no such attempts anywhere in the world, and the Japan Aerospace Exploration Agency (hereafter JAXA) was the first to make such an attempt in its project for the National EXperimental Supersonic Transport project (the NEXST project). In this project, an unmanned and scaled supersonic experimental airplane was designed and developed by assuming a case of a subsonic leading edge with the swept wing contained within the Mach cone; first a theoretical pressure distribution on the main wing upper surface causing the boundary layer transition occurring in proximity to the wing leading edge to be delayed significantly in the direction of the wing trailing edge was created, and then a new main wing design method to realize this distribution was developed (see K. Yoshida, "Supersonic drag reduction technology in the scaled supersonic experimental airplane project by JAXA", Progress in Aerospace Sciences, Vol. 45, No. 4-5, pp. 124-146 (2009); K. Yoshida, "Overview of NAL's Program Including the Aerodynamic Design of the Scaled Supersonic Experimental Airplane", Fluid Dynamics Research on Supersonic Aircraft of VKI, RTO Educational Notes 4, 1998; K. Yoshida and Y. Makino, "Aerodynamic Design of Unmanned and Scaled Supersonic Experimental Airplane in Japan", ECCOMAS 2004; and K. Yoshida, "Flight Test Results of Supersonic Experimental Airplane (NEXST-1)", Nagare, Journal of Japan Society of Fluid Mechanics, Vol. 25, pp. 321-328 (2006)).

FIG. 11 is a flow diagram showing the natural laminar flow wing design method developed in the NEXST project.

This wing design method is the reverse of the normal method of determining the pressure distribution given a shape, and comprises a technique, given a pressure distribution, of determining the shape. In this main wing design method, first a conventional entire airframe shape as an initial shape is prepared, designed with the goal of reducing the pressure drag; the target pressure coefficient distribution (Cp, target-upper) on the main wing upper surface is created based on a usual CFD analysis method and transition point prediction method ($e^N$ method; FIG. 9), while on the other hand, the main wing lower surface target Cp distribution (Cp, target-lower), is created by combining a difference between lower and upper surface pressure difference distribution ($\Delta$Cp, target) derived from a Carlson type warp wing design method with the design concept of reducing the lift-dependent drag, which is one type of pressure drag, with the main wing upper surface target Cp distribution (Cp, target-upper). Next, a CFD analysis method is applied to the main wing cross-sectional shape of the initial airframe shape, a new pressure distribution in the vicinity of this main wing cross-sectional shape is determined, and then the difference between this pressure distribution and the above target Cp distribution (Cp, target) is calculated; by repeating corrections to the main wing shape and CFD analysis until this calculated difference becomes smaller than a prescribed difference value (threshold), the main wing cross-sectional shape is determined (hereafter this method of shape determination is called the CFD-based inverse problem design method). Here, CFD is a flow field analysis technique based on numerical fluid dynamics, and the usual CFD analysis method, given a shape, uses CFD to determine a physical quantity of a flow field in the vicinity; the CFD-based inverse problem design method, given a pressure distribution which characterizes a flow field, determines a shape realizing this distribution by combining usual CFD analysis and the shape correction method. Hence when designing a main wing cross-sectional shape based on this main wing design method, it is essential that, among the main wing upper and lower surface target Cp distributions (Cp, target), the main wing upper surface target Cp distribution (Cp, target-upper) in particular be set (created) with high precision. As explained above, in the flight conditions (high-Reynolds number state) of a large-scale commercial supersonic transport (large-scale SST), there is no prior example of a large-scale SST having a natural laminar flow wing which reduces the friction drag on the wing upper surface, and so at present there is no public data whatsoever for the pressure distribution on the main wing upper surface which is effective for natural laminarization of the wing upper surface in the high-Reynolds number state. Further, creation of the target Cp distribution (Cp, target-upper) of this main wing upper surface requires an excessive amount of effort, since the pressure distribution must be set over the entire main wing surface along the wing chordwise direction from the wing leading edge to the wing trailing edge at each spanwise station.

The above-mentioned Cp distribution (i.e. pressure coefficient distribution) makes the pressure distribution more accurate, and the concept of Cp distribution is expressed same as the one of pressure distribution. Hereinafter, the above is adapted.

At JAXA, on the assumptions that in the NEXST project the standpoint of pressure drag reduction from the supersonic leading edge is superior, and that application is to a case of a subsonic leading edge with superior low-speed performance, first each of the above-described types of pressure drag reduction design concepts was applied in design using linear theoretical techniques (pressure drag reduction concepts 1, 2, 3 in FIG. 12A). Next, an attempt was made to develop a natural laminar flow wing design method limited to the main wing upper surface, using a CFD-based inverse problem design method. In this natural laminar flow wing design method, first a theoretical pressure distribution shape to delay the boundary layer transition on the main wing upper surface is found (FIG. 12B), then this theoretical pressure distribution is set as the target pressure distribution, using the above-described pressure drag reduction concept the designed shape is selected as the initial airframe initial shape, based on this wing cross-sectional shape the CFD analysis method is used to estimate the main wing upper and lower surface pressure distributions, and the CFD analysis is repeated, while making slight corrections to the main wing shape, until the difference between the estimated pressure distribution and the target pressure distribution becomes smaller than a fixed value. By means of a natural laminar flow wing design method based on a CFD-based inverse problem design method employing repetition of this usual CFD analysis and shape correction, a specific wing cross-sectional shape was designed (FIG. 12C). As the method of slight shape corrections used here, based on formulation of supersonic linear theory (lifting surface theory), and utilizing the fact that pressure changes and the camber and thickness changes are in a one-to-one relationship, numerical solution of an integral equation defining this relationship was employed.

The effect of a natural laminar flow wing designed in this way was first qualitatively validated in wind tunnel tests (FIG. 12D). Here, "qualitatively" means that, in the case of wind tunnel tests, because disturbances necessarily occur in the mechanism of the wind tunnel generating a supersonic airflow, the airflow from upstream already includes significant small turbulence, and this is combined with instability of the boundary layer so that there exists a physical mechanism promoting transition, and insofar as it is generally difficult to eliminate this influence (in rare and specific wind tunnel conditions, it has been possible to greatly suppress this wind tunnel airflow turbulence, but complete elimination has not been possible), it is thought that the effect of some airflow turbulence is exerted on the transition phenomenon. Hence at JAXA, an unmanned and scaled supersonic experimental airplane was manufactured, and validation of natural laminar flow wing design was conducted through an actual flight environment without airflow turbulence. The total length of the airframe of the experimental airplane was 11.5 m, and was an aircraft scaled down to 11% from the assumed size of an actual large-scale SST. As the result of analysis of transition data measured in the flight test, it was confirmed that at the design point the transition point was delayed approximately 40% along the wing chord length, and the effect of the natural laminar flow wing design concept in NEXST-1 experimental airplane was validated (see FIG. 12D and K. Yoshida, "Supersonic drag reduction technology in the scaled supersonic experimental airplane project by JAXA", Progress in Aerospace Sciences, Vol. 45, No. 4-5, pp. 124-146 (2009)).

However, in these experiments, insofar as a scaled airplane of total length 11.5 m was used, the Reynolds number is also 11% of that of the assumed large-scale SST, and the above-described natural laminar flow wing design method developed in the NEXST project has problems from the standpoint of establishing techniques for application to actual aircraft design; it became clear that there is a need for considerable improvement of the target pressure distribution shape found in the design of NEXST-1 airplane (see Y. Ueda and K. Yoshida, "Numerical Study on Optimum Pressure Distribution for Supersonic Natural Laminar Flow Wing Design", Proc. 32nd Fluid Dynamics Conference, 2000).

This is equivalent to an increase in Reynolds number causing strong amplification of instabilities in the boundary layer, so that creation of the target pressure distribution at the main wing upper surface should fully take into account the Reynolds number dependence. In particular, for high Reynolds numbers corresponding to actual aircraft, C-F instabilities are extremely strong, and in the target pressure distribution for the main wing upper surface found in the NEXST-1 actual airplane design as well, it was subsequently found that an adequate effect was not exhibited. Hence at JAXA, improvement of the pressure distribution so as to obtain a similar natural laminarization effect even for high Reynolds numbers equivalent to that of actual aircraft such as large-scale SSTs was studied. As a result, it was found, as one outcome, that if the accelerating gradient in proximity to the leading edge is made three times or more larger than during design of the NEXST-1 experimental airplane, an effect is obtained (see Y. Ueda and K. Yoshida, "Numerical Study on Optimum Pressure Distribution for Supersonic Natural Laminar Flow Wing Design", Proc. 32nd Fluid Dynamics Conference, 2000), but in subsequent detailed analyses, it became clear that although the basic approach of this outcome was qualitatively reasonable, quantitatively the effect was not necessarily as estimated, and extensive refinement was necessary. The main reason for this was errors arising from the precision of the model in the transition analysis method used at that time. Moreover, a versatile natural laminar flow wing design method which could be applied to objects other than the main wing surface of a NEXST-1 experimental airplane had not been constructed. This invention resolves these problems.

Finally, as research on natural laminarization at supersonic speeds, there has been research conducted independently in the U.S. in substantially the same period as the above-described NEXST project (see I. Kroo, P. Sturdza, R. Tracy and J. Chase, "Natural Laminar Flow for Quiet and Efficient Supersonic Aircraft", AIAA-2002-0146, 2002). This is a laminar flow wing design concept completely different from the natural laminar flow wing design concept of NEXST-1; whereas, as explained below, in the NEXST-1 design a technique of suppressing C-F instability is adopted, the essence of the design concept in the above research conducted in the U.S. has as a principal object the suppressing of T-S instability, and in contrast with a conventional main wing having a large sweep angle of 45° or greater, determined from the standpoint of reducing the pressure drag, a wing with a small sweep angle of approximately 10 to 20°, with a supersonic leading edge planform with a sharp leading edge, is addressed. When this leading edge has a characteristic cross-sectional shape with a sharp thin distribution, the pressure gradient in the flow direction reliably decreases monotonically, and so there is the advantage of an accelerating gradient which is effective for suppressing T-S instability; but because with the low aspect ratio the sweep angle is small, in the above-described range of approximately 10 to 20°, the lift-dependent drag increases, and it is thought that achievement of reductions in both friction drag and pressure drag is difficult. The effect of transition point delay through this technique has been visually confirmed in flight experiments with this main wing shape perpendicularly mounted to the lower fuselage of an F-15 fighter (however, the wing itself was equivalent to a scale model); an advanced engineering level with respect to confirmation of natural laminarization through an actual flight airframe is evident, but considering that a scale model was used (the Reynolds number did not correspond to that of an actual aircraft) and that simultaneous reduction of pressure drag was not attempted, this research is regarded as quite incomplete with respect to application to actual aircraft design. Moreover there is no research and activity development at all on natural laminarization in Europe, so that the utility of this invention can be emphasized.

SUMMARY OF THE INVENTION

This invention was devised in consideration of the above problems of the prior art, and has as an object provision of a method of design of a natural laminar flow wing of a large-scale commercial supersonic aircraft, in which, in addition to reduction of pressure drag which is conventionally an object of supersonic aircraft design, delays the wing surface boundary layer transition for the high Reynolds numbers corresponding to actual aircraft, and enables significant improvement of the lift-drag ratio.

In order to attain the above object, the natural laminar flow wing design method according to Claim 1 is a natural laminar flow wing design method having: a process of setting an initial shape of a wing cross-sectional shape; a CFD analysis process of determining pressure distribution of a flow field in the vicinity of the wing cross-sectional shape obtained; a transition analysis process of estimating a boundary layer transition position on a wing surface; a process of setting target pressure distributions for wing upper and lower surfaces based on the pressure distribution; and a CFD-based inverse problem design process including the CFD analysis process and a shape correction process correcting the cross-sectional wing shape such that the pressure distribution obtained from the CFD analysis process converges on the target pressure distribution, wherein among the target pressure distributions, the wing upper surface target pressure distribution defines a "wing chordwise direction from a wing leading edge to a wing trailing edge" as a domain at each wing spanwise station, and moreover is provided by a functional type with parameters dependent on the wing spanwise station as coefficients; then the sensitivity of the wing upper surface boundary layer transition due to fluctuations in each of the parameter values of the parameters is analyzed by the transition analysis process; and an optimal combination of parameter values that delays the wing upper surface boundary layer transition the furthest rearward at a desired Reynolds number is determined by performing a search.

In the above natural laminar flow wing design method, a new process, which facilitates creation of a target pressure distribution suited to a natural laminar flow wing which effectively delays the wing upper surface boundary layer transition even for a high-Reynolds number state corresponding to a large-scale SST, is added, adhering to the natural laminar flow wing design method developed in the NEXST project and the reasonableness of which was confirmed in wind tunnel tests and flight experiments of NEXST-1 airplane, that is, a CFD-based inverse problem design process comprising the steps of obtaining a target pressure distribution, performing usual CFD analysis to determine the wing cross-sectional shape realizing this distribution, and performing shape corrections. That is, for the wing upper surface target pressure distribution suited to natural laminarization, parameters dependent on each of the wing spanwise stations are defined by functional types having coefficients, and separate analyses of the sensitivity of boundary layer transition fluctuations to fluctuations in each parameter value are performed using a transition analysis method called the $e^N$ method; by performing a search for the optimal combination of each of the parameter values causing the boundary layer transition to be delayed the furthest rearward, a target pressure distribution can easily be created which delays rearward the wing upper surface boundary layer transition (transition to turbulence) even for high-Reynolds number states equivalent to large-scale SSTs.

In the natural laminar flow wing design method according to Claim 2, among the target pressure distributions, the wing lower surface target pressure distribution is determined based on the wing upper surface target pressure distribution, and the upper and lower surface pressure difference distribution which realizes the optimal combination of twist angle and camber distribution in the wing spanwise station.

In the above natural laminar flow wing design method, the wing lower surface target pressure distribution can easily be created by combining the wing upper surface target pressure distribution obtained by sensitivity analysis using the above parameter transition analysis method, and a wing upper and lower surface pressure difference distribution obtained by a design method to realize an optimal combination of twist angle and camber distribution in the wing spanwise direction, such as for example a warp design method. Hence by employing the pressure distribution obtained by combining the wing upper surface target pressure distribution and the wing lower surface target pressure distribution as the target pressure distribution in a CFD-based inverse problem design process, the wing pressure drag and friction drag are reduced, and a natural laminar flow wing of a large-scale SST can be designed which enables a great improvement in the lift-drag ratio.

In the natural laminar flow wing design method according to Claim 3, when the wing chord direction is an X axis, the wing spanwise direction is a Y axis, and a wing chord length (=c(y)) is used to make a point in the wing chord direction (X) from the wing leading edge at each wing spanwise station (Y=y) dimensionless ($\xi$=x/c(y)), the shape of the wing upper surface target pressure distribution at each of the wing spanwise stations is created such that, in an extremely narrow region from the wing leading edge in which $\Delta\xi$<0.01 is established, a rapid accelerating gradient of pressure and a rapid decelerating gradient are continuous, and in a subsequent broad region in which $\Delta\xi \leq \xi \leq 1$ is established, the pressure gently accelerates while simultaneously the acceleration amount is decreased and the gently accelerating gradient asymptotically approaching a predetermined value is continuous.

In the above natural laminar flow wing design method, a main wing for a large-scale SST, having a large sweep angle, is addressed. Hence the principal object is suppression of C-F instability, which is dominant in proximity to the leading edge of a wing with a large sweep angle of 45° or greater; next, an attempt was made to further incorporate suppression of T-S instability, which is dominant beyond proximity to the leading edge. Specifically, because C-F instability is the principal cause of the pressure gradient in the cross direction, reduction of the pressure gradients in all directions is a design principle from the first. However, upon adding the effects of the wing thickness, wing tips, and the occurrence of lift, it is not possible to keep the pressure gradient small.

Hence to begin with, as the pressure gradient in the flow direction, a distribution shape was devised such that the portion having a large change is limited to the initial region in proximity to the leading edge, over approximately 1% of the wing chord length, and thereafter, with development in the wing spanwise direction, there is almost no pressure gradient and the pressure level is substantially constant, so that comparatively large pressure gradients do not occur. This is thought to correspond to an ideal pressure distribution shape for natural laminarization, which is most suited to a main wing having a large sweep angle; the sensitivity to the transition characteristics of parameters characterizing the distribution shape were studied in detail, and specific distribution shapes were set for each Reynolds number corresponding to a main wing scale for application. Examining this distribution shape in the flow direction, there is extreme acceleration in proximity to the leading edge over approximately 0.5% of the wing chord length, and after reaching a minimum pressure point, there is extreme deceleration over a similar slight distance, then followed by a tendency toward gentle acceleration up to the wing trailing edge. The initial rapid acceleration is in order to shorten the above-described acceleration region, but the second rapid deceleration is provided in order to suppress the development of a crossflow occurring in the initial acceleration region, by providing a pressure gradient in the opposite direction. The higher the Reynolds number, the greater is the need to make extensive use of this effect; over all, this characteristic pressure distribution shape has as a major characteristic a substantially step-function shape.

In the natural laminar flow wing design method according to Claim 4, among the above wing upper surface target pressure distribution, for the maximum pressure attainment point (minimum pressure value) of the rapid acceleration gradient at each wing spanwise station and a predetermined value of the gentle acceleration gradient, based on setting values so as to be equal to the average values of pressure distributions over predetermined ranges of the wing chord length at the same wing spanwise stations of the initial pressure distribution obtained by applying the usual CFD analysis process to the initial shape, while performing the transition analysis process and tuning both values, the combination at which the transition point is moved furthest rearward is again set.

In the above natural laminar flow wing design method, considering that the development of the pressure distribution in the wing spanwise direction is directly related to crossflow instability (C-F instability), average pressure levels in a constant range, such as for example ranges from 20 to 80%, of the wing chord length at each wing spanwise station of the initial pressure distribution obtained by applying the usual CFD analysis process to the initial shape, are selected as representative values of the pressure distribution in the wing chordwise direction at each wing spanwise station, and the wing upper surface target pressure distribution is created at each wing spanwise station such that the maximum pressure attainment points (minimum pressure values) in proximity to the leading edge at each wing spanwise station are basically equal to these representative values, and also such that the asymptotic values at the wing trailing edge are basically equal to these representative values. By finding a combination of values for which the transition point is positioned furthest rearward while performing transition analysis and independently tuning the representative values, crossflow instability is suppressed.

In the natural laminar flow wing design method according to Claim 5, among the wing upper surface target pressure distribution, the pressure at the wing leading edge at each wing spanwise station is, as a basic principle, set to a value obtained by multiplying a stagnation point pressure, determined by the free-stream Mach number and the leading edge sweep angle of the wing, by a predetermined value.

In the case of a positive lift state, because in general the stagnation point is in proximity to the lower surface near leading edge, the value of the wing upper surface target pressure distribution at the wing leading edge should be set to a value which is somewhat lower. In this determination, the Cp value at the leading edge is calculated based on the results of CFD analysis of the initial shape, and adopting this value results in highest accuracy. Hence, this value may be used. However, the inventor of this application has found experimentally that, apart from determination from the results of CFD analysis, a value obtained by multiplying a stagnation point pressure (Cp, stagnation), determined from the freestream Mach number ($M_\infty$) and the leading edge sweep angle ($\Lambda_{LE}$), by a constant value, such as for example 0.86, satisfactorily fits the results of the CFD analysis method for the initial shape, and by using this value the design process becomes more efficient; hence as a basic principle, this value is set.

In the natural laminar flow wing design method according to Claim 6, when each of the wing spanwise stations (Y=y) is rendered dimensionless ($\eta \equiv y/s$) by a semispan of the wing (s), the wing upper surface target pressure distribution (Cp ($\xi$, $\eta$)) is defined by the following exponential function having as coefficients parameters $\{A_0(\eta), A_1(\eta), A_2(\eta), A_3(\eta), A_4(\eta), B_1(\eta), B_2(\eta), B_3(\eta)\}$ dependent on each wing spanwise station and parameters $\{P_1, P_2\}$ not dependent the same,

[Equation 1]

$$Cp(\xi, \eta) = A_0(\eta)\cdot 1 + A_1(\eta)\cdot[\exp(B_1(\eta)\xi)-1] + A_2(\eta)\cdot[\exp(B_2(\eta)\xi)-1] + A_3(\eta)\cdot[\exp(B_3(\eta)\xi^{P_1})-1] + A_4(\eta)\cdot\xi^{P_2},$$

the sensitivity of the wing upper surface boundary layer transition due to fluctuations of each of parameter values of the parameters is analyzed by the transition analysis process, and a search is performed for an optimal combination of parameter values that "delay the wing upper surface boundary layer transition the furthest rearward at a desired Reynolds number".

The inventor of this application has discovered that the above functional type can satisfactorily represent a target pressure distribution suited to natural laminarization which, at a desired Reynolds number, delays the wing upper surface boundary layer transition rearward, that is, a pressure distribution such that a rapid accelerating gradient in an extremely narrow range of approximately 1% of the wing chord length at the wing leading edge and a rapid decelerating gradient are continuous, with a gentle accelerating gradient continuing over a broad range thereafter. When determining each of the parameters, based on parameter values already determined (measured values), the transition analysis method is utilized to perform sensitivity analysis (parametric studies) to determine parameters. In this way, a target pressure distribution suited to natural laminarization is defined using a functional type having parameters as coefficients, the parameters are subjected to sensitivity analysis using the transition analysis method, and by searching for the optimum combination of parameter values to delay the boundary layer transition furthest rearward, a target pressure distribution can easily be created which, even in a high-Reynolds number state equivalent to that of a large-scale SST, delays the wing upper surface boundary layer transition rearward.

In a supersonic aircraft manufactured based on the natural laminar flow wing design method according to any one among Claims 1 to 6, the wing cross-sectional shape along the wing chord direction at each wing spanwise station is characterized in having a curvature in proximity to the leading edge (stagnation point) which is a constant value of ⅓ or less than that of a normal wing cross-sectional shape (a wing cross-sectional shape of the Concorde put to practical use as commercial supersonic aircraft) in a line element region of at least 0.1% of the wing chord length including the leading edge, and in having a curvature which further decreases rapidly to ¹⁄₁₀ or less of this constant value in a line element region of 0.2% of the wing chord length from the above line element region directed toward the trailing edge.

The above wing of a supersonic aircraft, in addition to reduction of pressure drag, can also reduce friction drag at the wing surface, and enables considerable improvement of the lift-drag ratio.

By means of a natural laminar flow wing design method of this invention, for an initial entire aircraft shape optimized so as to reduce pressure drag of a supersonic aircraft, friction drag on the main wing upper surface can be further reduced without adversely affecting lift-dependent drag of the main wing. In particular, there have been no preexisting technical reports, in a main wing planform (aircraft mode) having a subsonic leading edge in a large-scale SST flight environment (high-Reynolds number state), which have as an object the so-called natural laminarization of the main wing upper surface to broaden the laminar region and reduce friction drag as a result of delaying the main wing upper surface boundary layer transition, and so such a design method had also not yet been established; but by means of a natural laminar flow wing design method of this invention, it is possible to simultaneously reduce the lift-dependent drag (pressure drag) of the wing and fuselage, and the friction drag on the main wing upper surface, of a large-scale SST.

BRIEF DESCRIPTION OF THE DRAWINGS

FIG. 4A is an explanatory diagram showing the shape characteristics of a wing upper surface target Cp distribution suited to natural laminarization to delay the boundary layer transition point rearward in a high-Reynolds number state;

FIG. 5B shows the target Cp distribution of FIG. 5A;

FIG. 8 is an explanatory diagram showing the drag distribution of a supersonic aircraft, as academic background to this invention;

FIG. 10 is an explanatory diagram showing a physical mechanism of a transition phenomenon, as academic background to this invention;

FIG. 12A is an explanatory diagram showing the aerodynamic design concept of the JAXA scaled supersonic experimental airplane;

FIG. 12C is an explanatory diagram showing a summary of the CFD-based inverse problem design results of the JAXA scaled supersonic experimental airplane.

DESCRIPTION OF THE PREFERRED EMBODIMENTS

Figure 1:
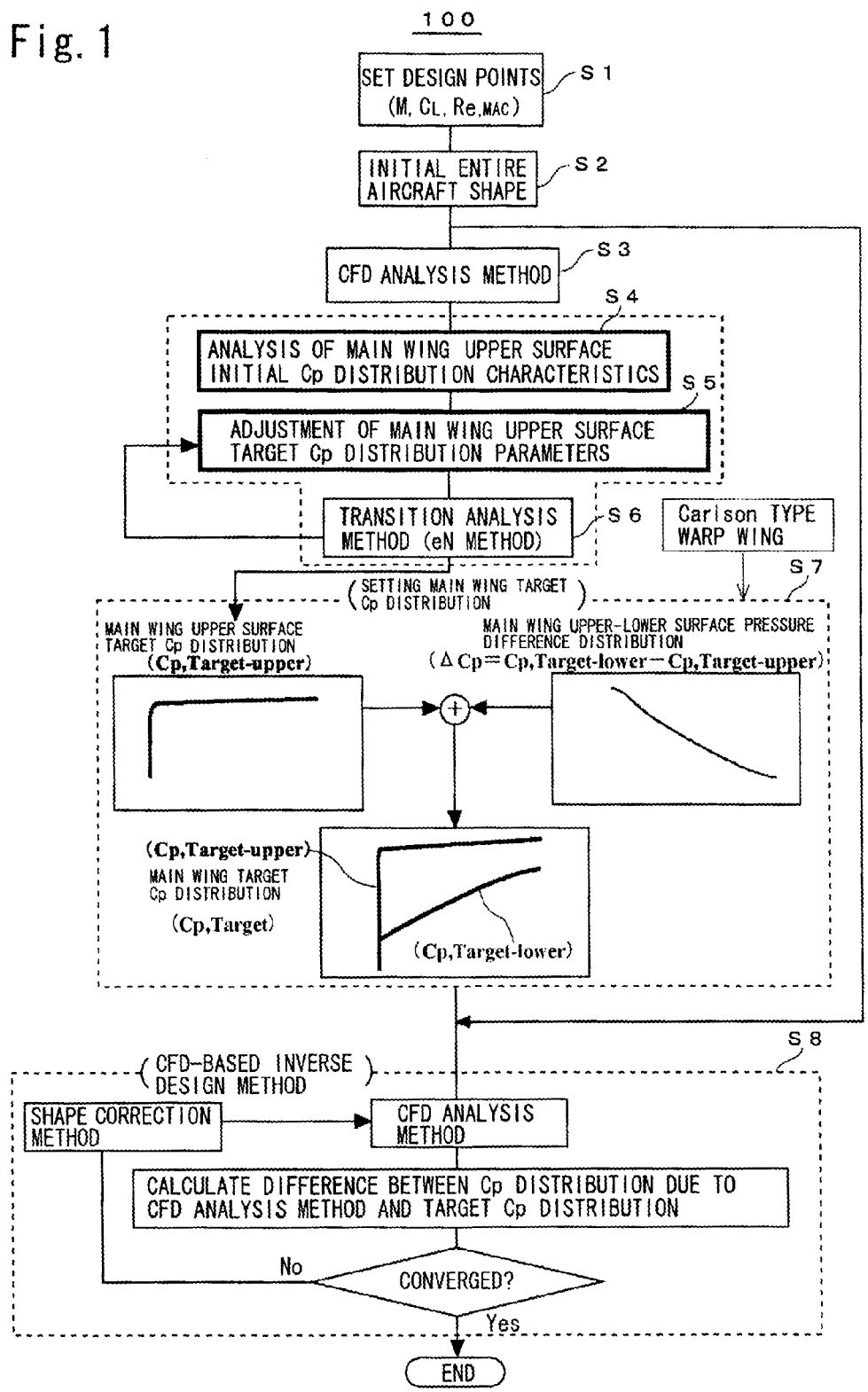
FIG. 1 is a flow diagram showing a natural laminar flow wing design method of this invention.

Below, the invention is explained in further detail through embodiments shown in the drawings.

FIG. 1 is a flow diagram showing a natural laminar flow wing design method of this invention.

Figure 11:
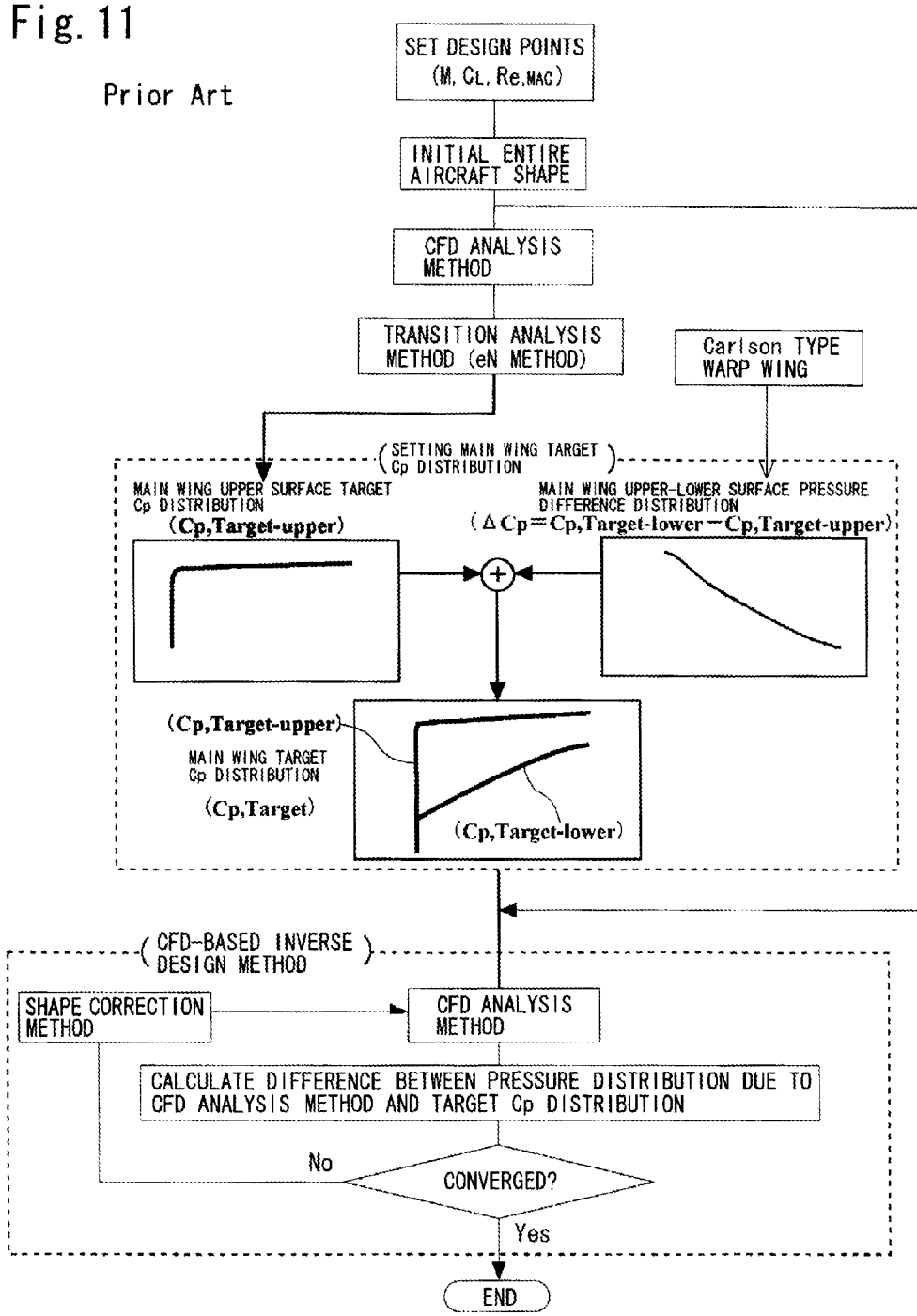
FIG. 11 is a flow diagram showing the natural laminar flow wing design method developed in the NEXST project.
Figure 12B:
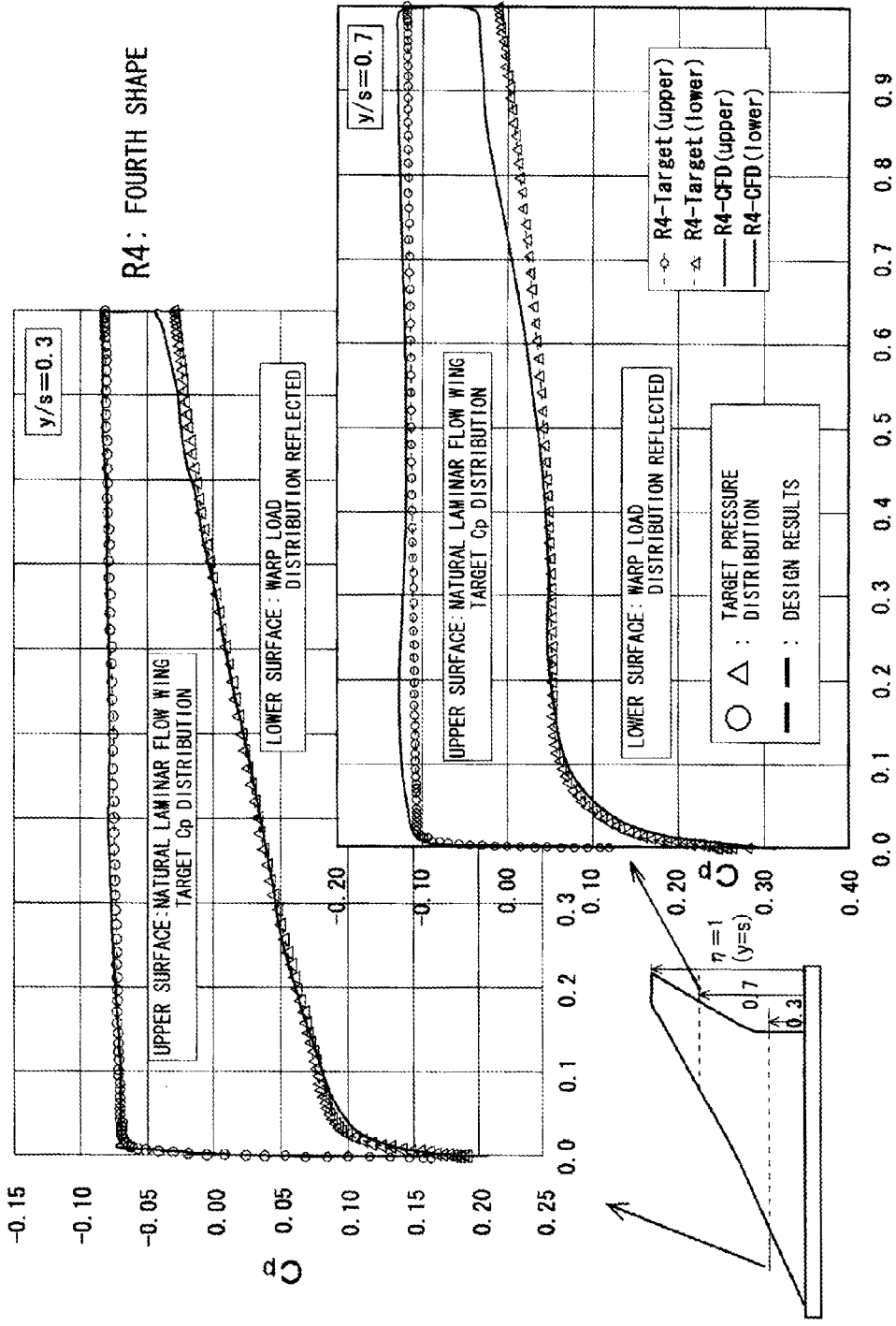
FIG. 12B is an explanatory diagram showing a summary of the design target Cp distribution of the JAXA scaled supersonic experimental airplane.
Figure 12D:
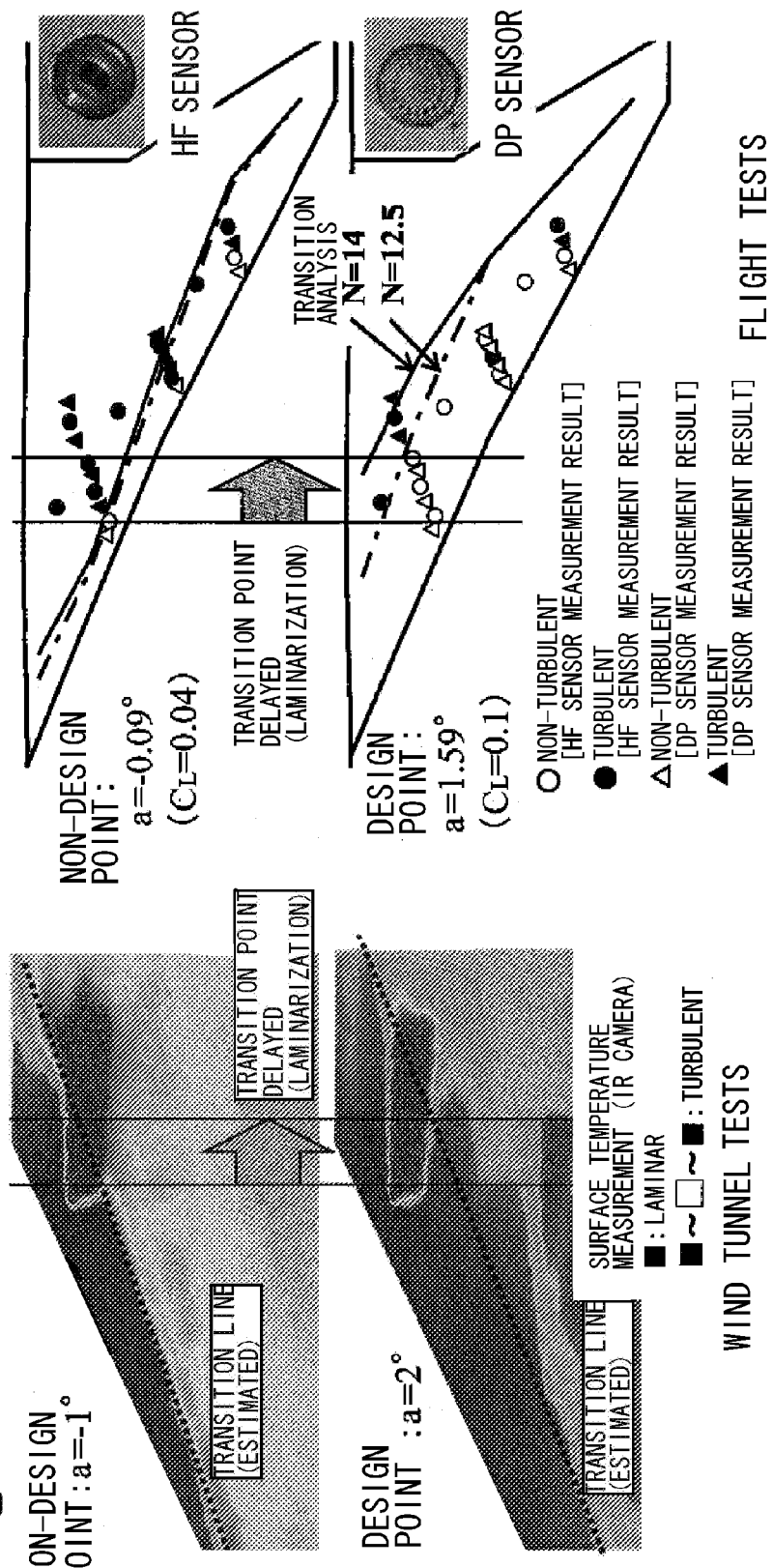
FIG. 12D is an explanatory diagram showing a summary of the results of experimental validation of the natural laminar flow wing design of the JAXA scaled supersonic experimental airplane.

This design method, while provided with a CFD-based inverse problem design method of determining a wing shape which realizes a given target pressure distribution, comprising a usual CFD analysis method of determining a pressure distribution in the vicinity of a given wing shape which is a characteristic of the natural laminar flow wing design method (hereafter called the "natural laminar flow wing design method of the prior art") developed in the NEXST project and shown in FIG. 11, and a shape correction method of correcting the wing shape such that the pressure distribution in the vicinity of the wing shape converges on the target pressure distribution, enables easy creation of a target pressure distribution (target Cp distribution) necessary for design of a natural laminar flow wing which reduces friction drag on the wing upper face (delays the boundary layer transition point rearward) under flight conditions equivalent to a large-scale SST (high-Reynolds number state), which had been difficult in the natural laminar flow wing design method of the prior art. Details are explained below referring to FIG. 3 and FIG. 4, but in flight conditions equivalent to a large-scale SST, a target Cp distribution of the main wing upper surface enabling a natural laminar flow wing is quantitatively defined by a functional type, taking the wing chord direction from the wing leading edge to the wing trailing edge at each wing spanwise station ($\eta$) as a domain ($\xi$), and having as coefficients a plurality of parameters (in this embodiment, $\{A_0, A_1, A_2, A_3, A_4, B_1, B_2, B_3\}$ which are dependent on the wing spanwise station. The base functional type remains unchanged, but a transition analysis method ($e^N$ method) is used for the parameters and sensitivity analysis (parametric study) applied, to enable easy creation of a target Cp distribution which is useful for a natural laminar flow wing having satisfactory boundary layer transition characteristics in flight conditions which assume a large-scale SST (a high-Reynolds number state), that is, which delays the boundary layer transition point on the main wing surface rearward.

Hence in addition to a conventional natural laminar flow wing design method, the flow of FIG. 1 adds a process of analyzing the main wing upper surface initial Cp distribution characteristics obtained by applying usual CFD analysis to the initial entire aircraft shape (step S4), and a process of adjusting the parameters of the main wing upper surface target Cp distribution by sensitivity analysis using the $e^N$ method (steps S5 and S6). That is, as the first step an initial entire aircraft shape is designed with the goal of reducing pressure drag (steps S1 and S2); next, usual CFD analysis is performed for this initial entire aircraft shape, and the main wing upper surface pressure distribution characteristics are analyzed (steps S3 and S4). Next, based on the results of this analysis, the parameters of the functional type for the (main wing upper surface) target Cp distribution are adjusted (steps S5 and S6). Then, based on a main wing upper and lower surface pressure difference distribution obtained through a warp wing design (Carlson type warp wing design), the main wing lower surface pressure distribution shape is calculated, and the main wing target Cp distribution necessary for the CFD-based inverse problem design method is set (step S7). The CFD analysis method is applied to the cross-sectional wing shape of the initial entire aircraft shape, shape correction is made to eliminate the difference between the Cp distribution due to the CFD analysis method and the above-described main wing target Cp distribution, and this process is repeated until the difference converges (step S8). Normally, as this shape correction method, an equation based on supersonic linear theory is used; but even if the linear approximation error becomes large with the wing thickness and in the proximity of the leading edge, insofar as the CFD analysis method incorporating nonlinear effects is repeatedly used, this method is thought to be the most efficient.

Below, each of these steps is explained.

First, as step S1, design points are set. As design points, for example, a cruise Mach number M, cruise lift coefficient $C_L$, angle of attack $\alpha$, Reynolds number based on the mean aerodynamic chord $R_{e,MAC}$, cruise flight altitude H, aircraft length L, mean aerodynamic chord MAC, and sweep angle $\Lambda_{LE}$ are set.

As the ranges of the above design points, the Mach number M is for example in the range 1.4≤M≤3.0. The Reynolds number based on the mean aerodynamic chord is for example in the range 14 million≤$R_{e,MAC}$≤180 million. The cruise flight altitude is for example in the range 16 km (M=1.4)≤H≤20 km (M=3.0). The entire aircraft length is for example in the range 48 m (small-scale SST)≤L≤105 m (large-scale SST). The mean aerodynamic chord is for example in the range 13 m≤MAC≤S 48 m. And, the sweep angle is for example in the range 45° (M=1.4)≤$\Lambda_{LE}$≤80° (M=3.0).

As one example, the design points in this embodiment were set as follows.

(1) M=2.0, $C_L$=0.1, α=2°
(2) H=18.3 km, $R_{e,MAC}$=120 million
(3) L=91.4 m, MAC=25 m Next, as step S2, the initial entire aircraft shape is set. First the initial entire aircraft shape is set with the goal of reducing pressure drag. Principal pressure drag components include volume-dependent wave drag and lift-dependent drag; as a design concept to reduce volume-dependent wave drag, for example an area-rule fuselage is adopted, and as a design concept to reduce lift-dependent drag, for example an arrow-type planform and a Carlson-type warp wing (optimally combining camber and twist angle distributions) was adopted.

Figure 2:
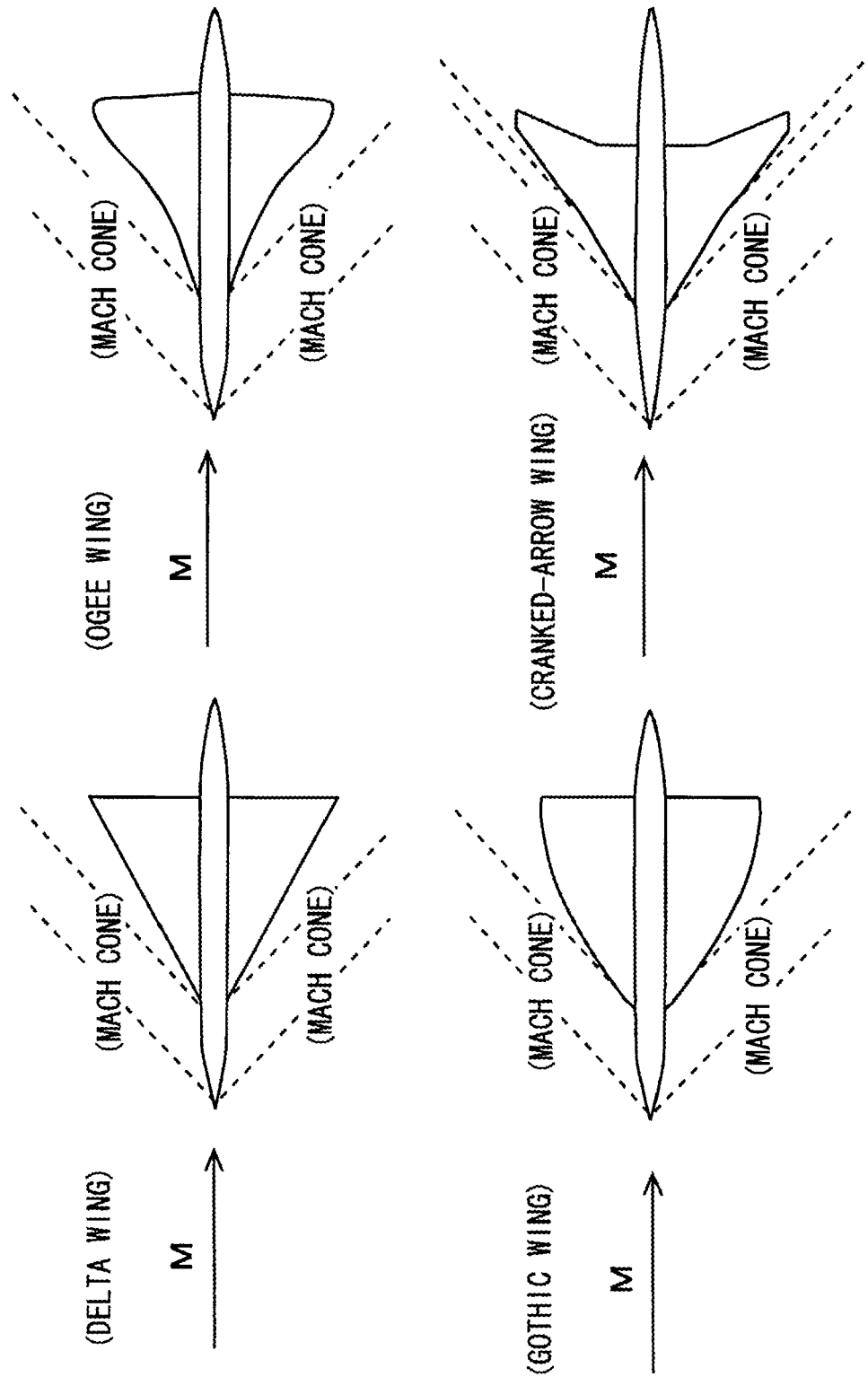
FIG. 2 is an explanatory diagram showing examples of representative main wing planforms of an SST aircraft addressed by this invention.

FIG. 2 is an explanatory diagram showing representative SST planforms assumed as shapes to be addressed by this invention. In this invention, if the planform (subsonic leading-edge type) exists with the leading edge of the main wing on the inside of the Mach cone generated from each of the portions as shown in FIG. 2, application is basically possible regardless of the planform. Application is possible for Mach numbers from approximately 1.4 to 3.0, and as a result for planforms of which the leading edge sweep angle is between approximately 45 and 80°. As the scale of the entire aircraft, the already-validated JAXA scaled supersonic experimental airplane (NEXST-1 airplane, total length 11.5 m) is included, and from small-scale SSTs (total length 48 m-class) with a capacity of 35 to 50 passengers, to a Concorde-type middle-scale SST (total length 62 m-class) carrying 100 passengers, up to large-scale SSTs (total length 91 m-class) carrying 300 passengers, are assumed; Reynolds numbers based on the mean aerodynamic chord (MAC) in the range 14 million to 180 million are covered. Of course, even for smaller Reynolds numbers of 14 million or lower, in terms of aerodynamic characteristics the boundary layer instability on the main wing upper surface is reduced, and so this invention can be applied without modification.

Next, as step S3, the CFD analysis method (CFD flow-field analysis method) is applied to the initial entire aircraft shape. The analysis results (estimation results) are used to determine the parameters {$A_0$, $A_1$} among the above parameters related to the target Cp distribution functional type which is a design target in the natural laminar flow wing design method of this invention.

Next, as step S4, the characteristics of the main wing upper surface initial Cp distribution are analyzed.

Figure 3:
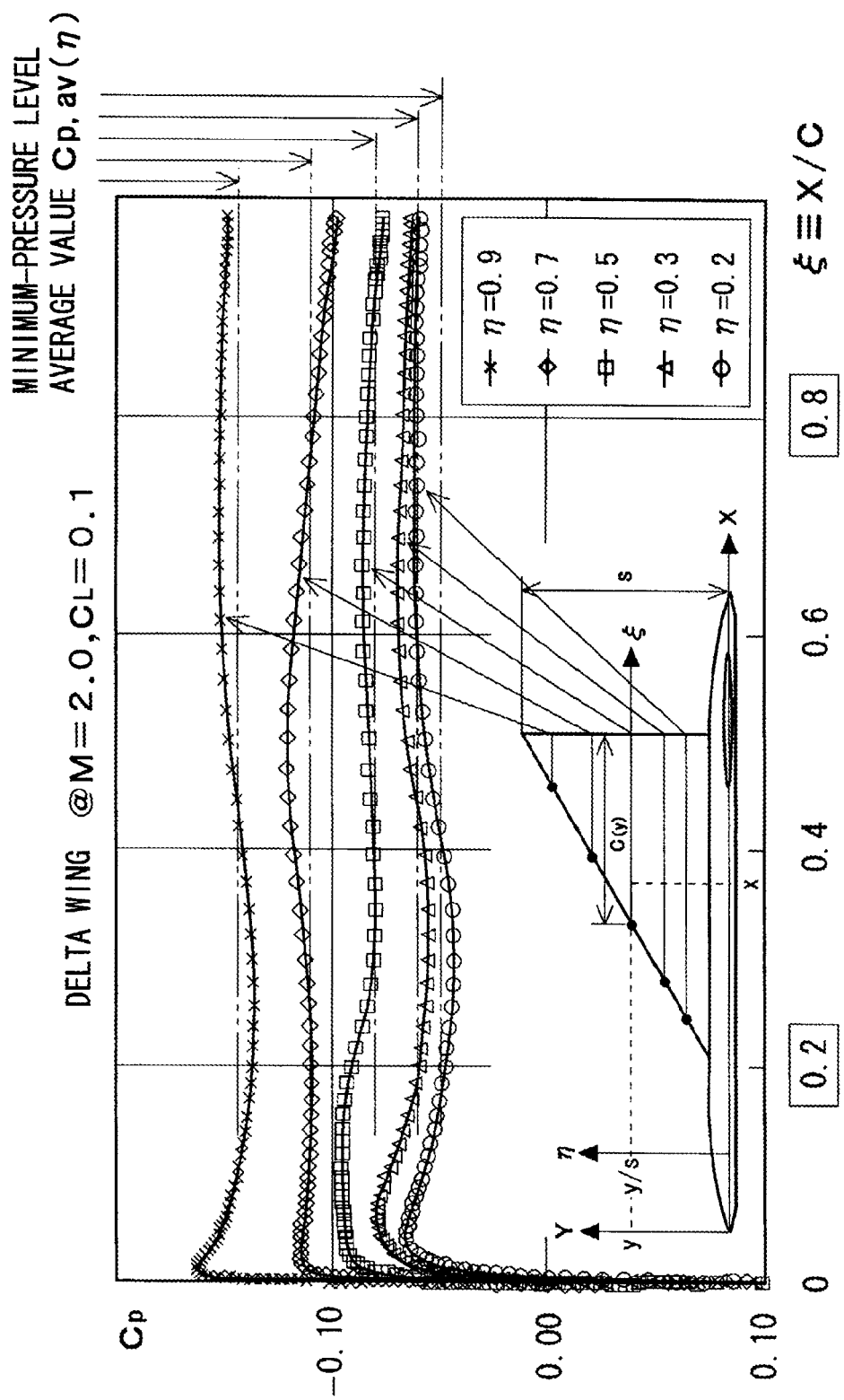
FIG. 3 is an explanatory diagram showing wing upper surface pressure distributions obtained by applying a usual CFD analysis method to an initial entire aircraft shape (delta planform)

FIG. 3 is an explanatory diagram showing wing upper surface Cp distributions obtained by applying the CFD analysis method to an initial entire aircraft shape (for example, delta planform). The vertical-axis is a pressure coefficient Cp obtained by rendering dimensionless the difference with the uniform-flow static pressure using the dynamic pressure. Normally upward is taken to be negative, and the upward tendency in the Cp distribution diagram indicates the direction of acceleration as the flow velocity.

In this Cp distribution, in order to facilitate analysis, chordwise position (X) at each wing spanwise station (Y=y) is defined as a new variable ξ (≡X/c(y)) rendered dimensionless (=X/c(y)) by the wing chord length (=c(y)) with the wing leading edge as the origin. That is, through processing to render the abscissa dimensionless, the domain of the Cp distribution in the chordwise direction at each wing spanwise station is all between 0 and 1 regardless of the wing spanwise station, and a plurality of Cp distributions at different wing spanwise stations can be displayed simultaneously on the same coordinate plane. FIG. 3 shows Cp distributions at six representative wing spanwise stations (y/s=0.2, 0.3, 0.5, 0.7 and 0.9).

Similarly in the wing spanwise direction (y), the coordinate is rendered dimensionless (=y/s) by the semispan value (=s), and defined as a new variable η (≡y/s).

As is clear from the figure, in general the mean value of the pressure level in the rearward portion from the wing center in the Cp distribution has a tendency to rise on moving from the inner wing region toward the outer wing region (as η increases). Hence $A_1$ is defined so as to adhere to this tendency. The simplest method of making settings is thought to be to use the mean values ($C_{p,av(\eta)}$) themselves of the pressure levels near wing chord lengths from 20 to 80% (0.2≤ξ≤0.8) as $A_1$(0.2), $A_1$(0.3), $A_1$(0.5), $A_1$(0.7) and $A_1$(0.9) at each of the above spanwise stations.

Next, $A_0$ is the value of the target Cp distribution at the leading edge (ξ=0), but in the case of a positive lift state, in general the stagnation point is in proximity to the lower surface near the leading edge, and so a value which is somewhat lowered from the pressure at the stagnation point should be set. This is determined most accurately by calculating the value of Cp at the leading edge (each Cp in FIG. 3 where ξ=0) based on the results of usual CFD analysis; but when a simpler setting method is to be used, as indicated in Equations 2 and 3 below, it is recommended that a value be set which is equal to 0.86 times the value of Cp at the stagnation point (Cp, stagnation), determined from the uniform-flow Mach number ($M_\infty$) and the leading edge sweep angle ($\Lambda_{LE}$) according to an iso-entropy equation.

[Equation 2]

$$Cp, \text{stagnation} = [\{1 + 0.2 M_4^2 (1 - \sin^2 \Lambda_{LE})\}^{3.5} - 1] \times (0.7 M_4^2)^{-1}$$

[Equation 3]

$$A_0 = 0.86 \times Cp, \text{stagnation}$$

Next, as step S5, parameters of the main wing upper-surface target Cp distribution are adjusted.

FIG. 4A is an explanatory diagram showing the shape characteristics of a wing upper surface target Cp distribution suited to natural laminarization to delay the boundary layer transition point rearward in a high-Reynolds number state.

Major characteristics of this wing upper surface target Cp distribution are a rapid accelerating gradient (parameter $A_1$) in an extremely narrow region in proximity to the leading edge (for example, Δξ<0.01) continuous with a rapid decelerating gradient (parameter $A_2$), after which, while gently accelerating, the acceleration amount is gradually reduced, and a slowly accelerating gradient continues to the wing trailing edge.

This rapid acceleration in proximity to the leading edge, similarly to the design concept of the NEXST-1 airplane, is based on the concept of suppressing the occurrence of crossflow in proximity to the leading edge where crossflow is strongest by narrowing the accelerating region in chordwise direction, which is the main cause thereof. However, in contrast with the flight conditions of the NEXST-1 airplane, the Reynolds number for this large-scale SST to which this invention is applied is larger by a factor of 10 or more, and the acceleration amount must be greatly increased.

Next, with respect to deceleration from parameter $A_1$ to parameter $A_2$, the aim is, by providing an adverse chordwise pressure gradient at each spanwise station, to obtain an effect of promoting growth of a crossflow which cannot suppress C-F instability by narrowing the acceleration region in the wing chordwise direction to 0.5% or less of the wing chord length through rapid acceleration. Thereafter a gentle acceleration is mainly intended to suppress T-S instability, but the change in acceleration amount from parameters $A_2$ to $A_3$ is also set so as to be effective in suppressing crossflow.

Below, the parameters $\{A_0, A_1, A_2, A_3, A_4, B_1, B_2, B_3, P_1, P_2\}$ are explained briefly.

The parameter $A_0$ characterizes the pressure at the wing leading edge ($\xi=0$). As a specific value, either the estimated values of the wing upper surface initial Cp distribution (FIG. 3) obtained by applying the CFD analysis method to the initial entire aircraft shape in step S3 of FIG. 1 is used or the value obtained by multiplying 0.86 by the value of Cp at the stagnation point (Cp, stagnation) determined from the uniform-flow Mach number ($M_\infty$) and the leading edge sweep angle ($\Lambda_{LE}$) according to the iso-entropy equation, is used.

The parameter $A_1$ characterizes the minimum-pressure point (maximum-acceleration point). As a specific value, the estimated value of the wing upper surface Cp distribution (Cp, av($\eta$) in FIG. 3) obtained by applying the CFD analysis method to the initial entire aircraft shape in step S3 of FIG. 1, or an approximated value, is set.

Parameter $A_2$ characterizes the maximum-pressure point (minimum-acceleration point). As a specific value, a negative value is set.

Parameter $A_3$ characterizes the constant value which is asymptotically approached by the pressure distribution at the wing trailing edge ($\xi=1$). As a specific value, a positive value proportional to the sweep angle $\Lambda_{LE}$ is set.

Parameter $A_4$ characterizes the shift from the constant value at the wing trailing edge ($\xi=1$). As a specific value, a negative value the absolute value of which is proportional to the sweep angle $\Lambda_{LE}$ is set.

Parameter $B_1$ characterizes the rapidly accelerating gradient. As a specific value, a negative value the absolute value of which is a large value of order $10^4$ is set.

Parameter $B_2$ characterizes the rapidly decelerating gradient. As a specific value, a negative value the absolute value of which is proportional to the sweep angle $\Lambda_{LE}$ is set.

Parameter $B_3$ characterizes the gradually accelerating gradient. As a specific value, a negative value the absolute value of which is proportional to the sweep angle $\Lambda_{LE}$ is set.

The default value of $P_1$ is 2.0, and the default value of $P_2$ is 1.0.

Figure 4B:
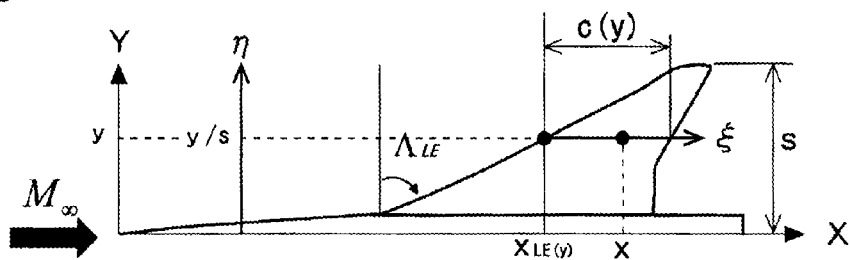
FIG. 4B is an explanatory diagram showing an example of a functional type defining a main wing upper surface target Cp distribution suited to natural laminarization to delay the boundary layer transition point rearward, in a high-Reynolds number state assuming a large-scale SST.

FIG. 4B is an explanatory diagram showing an example of a functional type defining a main wing upper surface target Cp distribution suited to natural laminarization to delay the boundary layer transition point rearward, in a high-Reynolds number state assuming a large-scale SST.

This functional type can define a target Cp distribution suited to natural laminarization (delay of the boundary layer transition point rearward in a high-Reynolds number state) in which, in an extremely narrow region in proximity to the leading edge, the rapidly accelerating gradient and the rapidly decelerating gradient are continuous, thereafter while gently accelerating the acceleration amount is gradually decreased, and the gently accelerating gradient continues until the wing trailing edge.

This functional type can be expressed as a sum of linear combination of base functions comprising $f_0=1$, $f_1=\exp(B_1(\eta)\xi)-1$, $f_2=\exp(B_2(\eta)\xi)-1$, $f_3=\exp(B_3(\eta)\xi^{P1})-1$, $f_4=\xi^{P2}$ having as internal variables any of the parameters $\{B_1(\eta), B_2(\eta), B_3(\eta)\}$ depending on the wing spanwise station ($\eta$) and the parameters $\{P_1, P_2\}$ not depending on the wing spanwise station ($\eta$), and the parameters $\{A_0(\eta), A_1(\eta), A_2(\eta), A_3(\eta), A_4(\eta)\}$ depending on the wing spanwise station ($\eta$). That is, a target Cp distribution suited to natural laminarization can be defined in advance as a function not only of the wing chordwise position ($\xi$), but also of the wing spanwise station ($\eta$).

[Equation 4]

$$Cp(\xi, \eta) = A_0(\eta) \cdot 1 + A_1(\eta) \cdot [\exp(B_1(\eta)\xi)-1] + A_2(\eta) \cdot [\exp(B_2(\eta)\xi)-1] + A_3(\eta) \cdot [\exp(B_3(72)\xi^{P1})-1] + A_4(72) \cdot [\xi^{P2}]$$

In this way, by using a functional type having parameters as coefficients to define a wing upper surface target Cp distribution suited to natural laminarization in which the boundary layer transition point is delayed rearward in a high-Reynolds number state, even in a case where the large-scale SST shown in FIG. 5 described below is assumed, by determining the parameters, the wing upper surface target Cp distribution is determined. Regarding determination of parameters, by repeating several times (two to three times) for each parameter a so-called sensitivity analysis (parametric study) to evaluate fluctuations in the boundary layer transition position for fluctuations in each parameter value using the $e^N$ method, based on measured values for each parameter (specific parameter values), it is possible to easily find an optimal combination of parameter values to delay the boundary layer transition.

In this way, given the Cp distribution defined by a functional type, analysis of transition characteristics using the $e^N$ method can be performed using only simple calculations, and so this parametric study is not a particularly difficult task.

Hence in this invention, by defining in advance a target Cp distribution suited to natural laminarization using a functional type having parameters as coefficients, and performing sensitivity analysis of the parameters in ranges based on measured values (suited to natural laminarization), a target Cp distribution having satisfactory transition characteristics even for a high-Reynolds number state assuming a large-scale SST can always be found. This feature is a major characteristic of this invention, not seen in natural laminar flow wing design methods of the prior art.

Figure 5A:
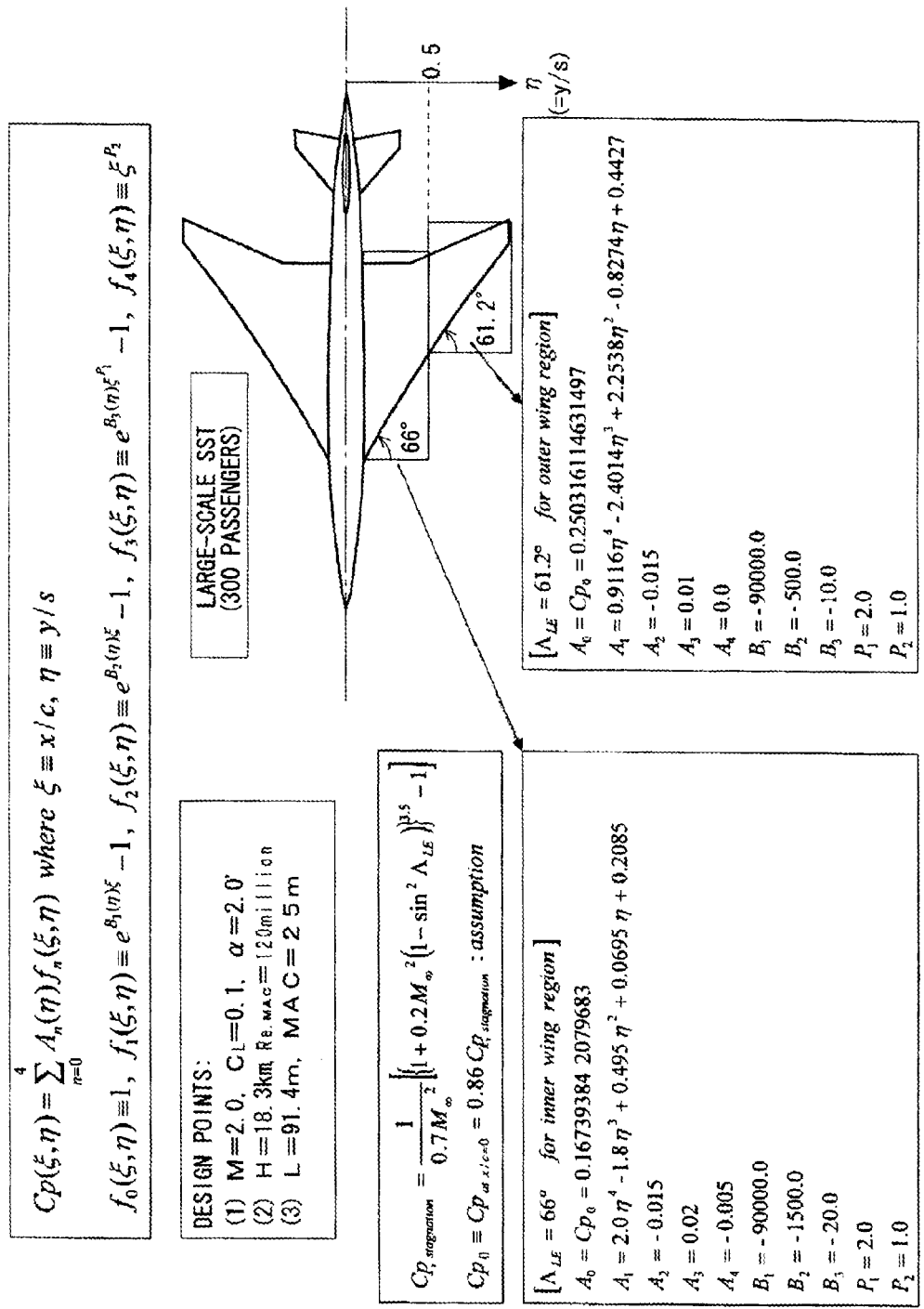
FIG. 5A is an explanatory diagram showing an example of parameters of a main wing upper surface target Cp distribution suited to natural laminarization to delay the boundary layer transition point rearward, in a high-Reynolds number state assuming a large-scale SST.

FIG. 5A is an explanatory diagram showing an example of parameters of a main wing upper surface target Cp distribution suited to natural laminarization to delay the boundary layer transition point rearward, in a high-Reynolds number state assuming a large-scale SST.

This figure presents parameter values of a target Cp distribution having transition characteristics with delays of 20% at the inner wing, and to substantially the trailing edge at the outer wing (realizing approximately 40% laminarization on average), obtained based on the main wing planform of the JAXA scaled supersonic experimental airplane (NEXST-1 airplane) by searching for a target Cp distribution in a Reynolds number state equivalent to expansion to a large-scale SST, using similar design points.

The main wing planform of this aircraft is a cranked-arrow type planform (inner wing sweep angle 66°, outer wing sweep angle 61.2°) with a kink of the leading edge at y/s=0.5 in the spanwise direction. The sweep angle differs on the inside (inner wing region) and on the outside (outer wing region) of this kink, and so the stagnation point pressures (Cp, stagnation) of each are different, and as a result a characteristic is seen in which the Cp distribution shape in proximity to the leading edge is broadly separated into two types. Hence there exist two types of parameters corresponding to each. Here, as the pressure at the wing leading edge ($A_0$), the value obtained by multiplying 0.86 by the Cp value at the stagnation point (Cp, stagnation), determined from the uniform-flow Mach number ($M_\infty$) and leading edge sweep angle ($\Lambda_{LE}$) according to the iso-entropy equation, was set.

The parameter $A_0$ for the inner wing is $A_0$=0.167393842079683, and that the parameter $A_0$ for the outer wing is $A_0$=0.250316114631497.

The parameter $A_1$ for the inner wing was determined, based on estimated values of the Cp distribution obtained by applying the CFD analysis method to the initial entire aircraft shape, by analyzing tendencies of the pressure average value (Cp, av ($\eta$) in FIG. 3) in the spanwise direction ($\eta$) over the range 20 to 80% in the chordwise direction at each wing spanwise station, using a function dependent on the spanwise station ($\eta$) (in this embodiment, a fourth-order polynomial).

The parameter $A_1$ for the inner wing is

[Equation 5]

$$A_1=2.0\eta^4-1.8\eta^3+0.495\eta^2+0.0695\eta+0.2085.$$

The parameter $A_1$ for the outer wing is

[Equation 6]

$$A_1=0.9116\eta^4-2.4014\eta^3+2.2538\eta^2+0.8274\eta-0.4427.$$

The parameters for the inner wing and outer wing ($A_2$, $A_3$, $A_4$, $B_1$, $B_2$, $B_3$, $P_1$, $P_2$) were respectively set to (−0.015, 0.02, −0.005, −90000.0, −1500.0, −20.0, 2.0, 1.0) and (−0.015, 0.01, 0.0, −90000.0, −500.0, −10.0, 2.0, 1.0).

FIG. 5B shows the target Cp distribution of FIG. 5A along the wing width direction ($\eta$). As stated above, as a characteristic of target Cp distributions of this invention, the distribution characteristics have a rapid pressure accelerating gradient in an extremely narrow region in proximity to the wing leading edge and a decelerating gradient, and so the pressure distribution in proximity to the wing leading edge (portions A and B) is shown separately, enlarged in the wing chord direction.

The planform of this aircraft is a cranked-arrow type planform with a kink of the leading edge at y/s=0.5 in the wing spanwise direction; because the sweep angles are different on the inside and the outside of this kink, the Cp, stagnation are different, and as a result the Cp distribution shape in proximity to the leading edge is seen to be separated into two types. This is because, as the above-described method of setting $A_0$, the simple method of multiplying Cp, stagnation by 0.86 is applied.

Further, a need is seen for fairly rapid deceleration from the minimum-pressure point in proximity to the leading edge. This is because when the sweep angle is large, at 60° or greater, the average value of the wing minimum-pressure level rises monotonically moving toward the wing tip in the Cp distribution diagram, so that no matter how rapid the acceleration in proximity to the leading edge, gathering this region in proximity to the leading edge, crossflow occurs due to the effect of the pressure gradient which always exists in the wing spanwise direction. That is, complete suppression of the increase in crossflow is difficult, so that by narrowing the above-described rapid deceleration, the effect is equivalent to imparting an external force so as to reverse the pressure gradient in the spanwise direction. (In actuality, because of the flow inertia, the direction of the crossflow velocity is not reversed immediately; but the tendency to increase in one direction is clearly suppressed.) In this way, a force coercing the crossflow in the opposite direction is utilized to slow the increase due to acceleration in proximity to the leading edge. This is a core concept of the present invention.

Figure 6:
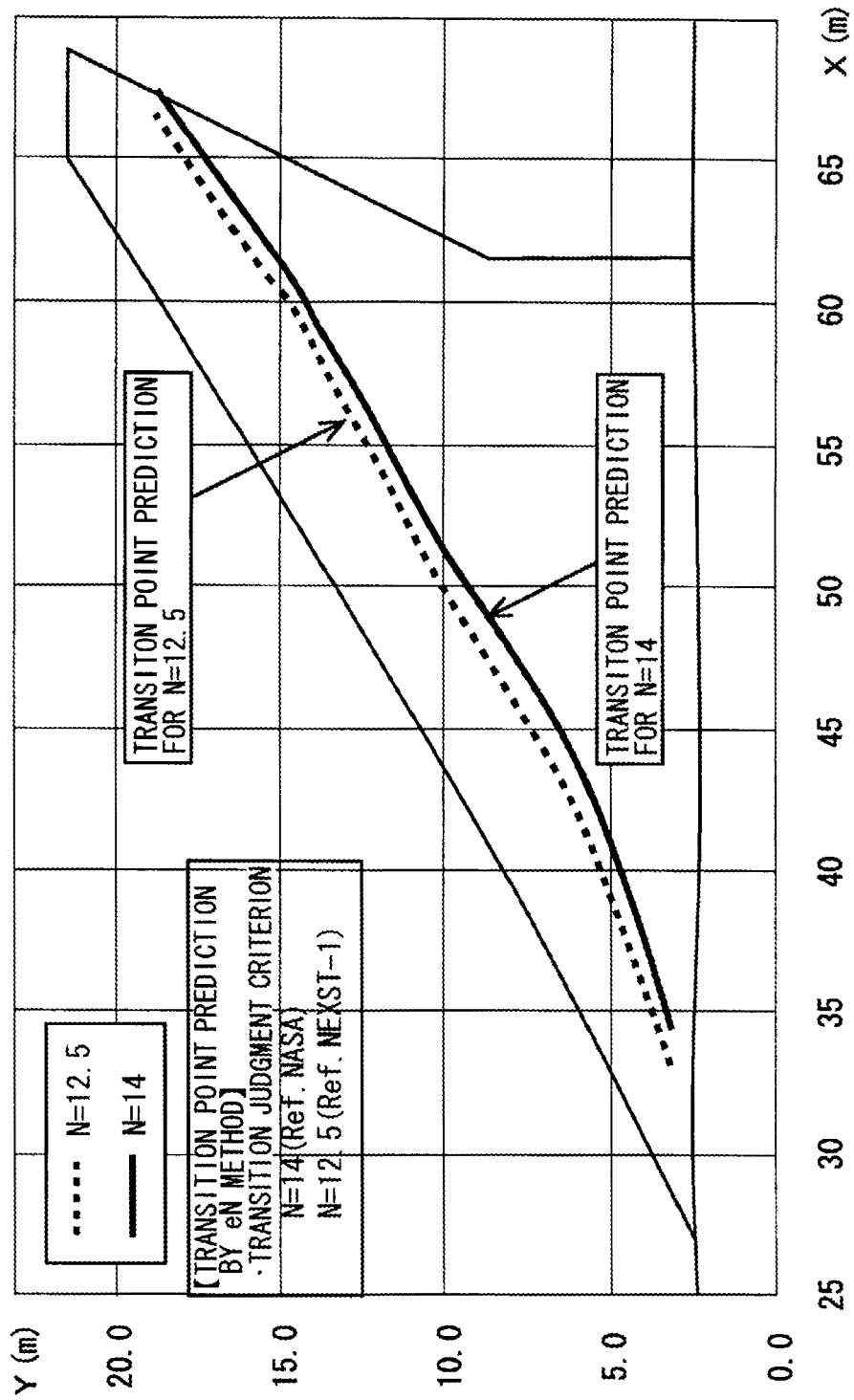
FIG. 6 is an explanatory diagram showing transition analysis results performed based on the target Cp distribution shape of FIG. 5B.

FIG. 6 is an explanatory diagram showing transition analysis results performed based on the target Cp distribution shape of FIG. 5B.

Here the transition analysis method is a technique at which the location at which minute disturbances, existing in the flow, develop temporally and spatially with the flow until the amplitude ($A_0$) thereof reaches a certain magnitude ($A=A_0 e^N$) is estimated as the position of transition from laminar to turbulent flow. That is, an $e^N$ method (see FIG. 10) is used in which the instability of the laminar boundary layer with respect to minute disturbances is analyzed, the amplification is integrated in the flow direction, and based on an index called the N value, the transition point is judged.

The only uncertain factor in this analysis method is the fact that the N value, corresponding to a transition judgment criterion in the flight environment, cannot be theoretically estimated. Hence a simple shape is actually mounted on an aircraft capable of supersonic flight, the transition is measured, and by comparison with the analysis results, estimation is performed. In the case of a complex shape, manufacture of such an actual aircraft is difficult, and so transition measurement tests are performed in one of the few special wind tunnels which exist worldwide (a wind tunnel in which airflow turbulence is reduced to approximately that of the flight environment), and through comparison with analysis results, a database relating to transition judgment criteria is being constructed.

In the analysis of FIG. 6, a NASA result (N=14) was used as an example of such a database. At JAXA, through comparisons of data measured in flight experiments of the scaled supersonic experimental airplane with analysis results, independent judgment criterion has been found (N=12.5). Analysis results using this value are also shown.

Upon examining analysis results, it is seen that if N=14 is adopted as the transition judgment criterion, then the local wing chord length is increased for the inner wing, so that with respect to transition characteristics, considerable delay of the transition point is difficult, and for this target Cp distribution the transition is at approximately 15% of the wing chord length; on the other hand, for the outer wing the local Reynolds number is lowered, so that transition characteristics are good, and the transition point is delayed until nearly the trailing edge. As a result, it is estimated that laminarization of approximately 26% on average can be achieved. Hence an advantageous result of a lift-drag ratio improvement to approximately 0.4 (a reduction by approximately 5% in overall drag) is estimated.

Figure 7A:
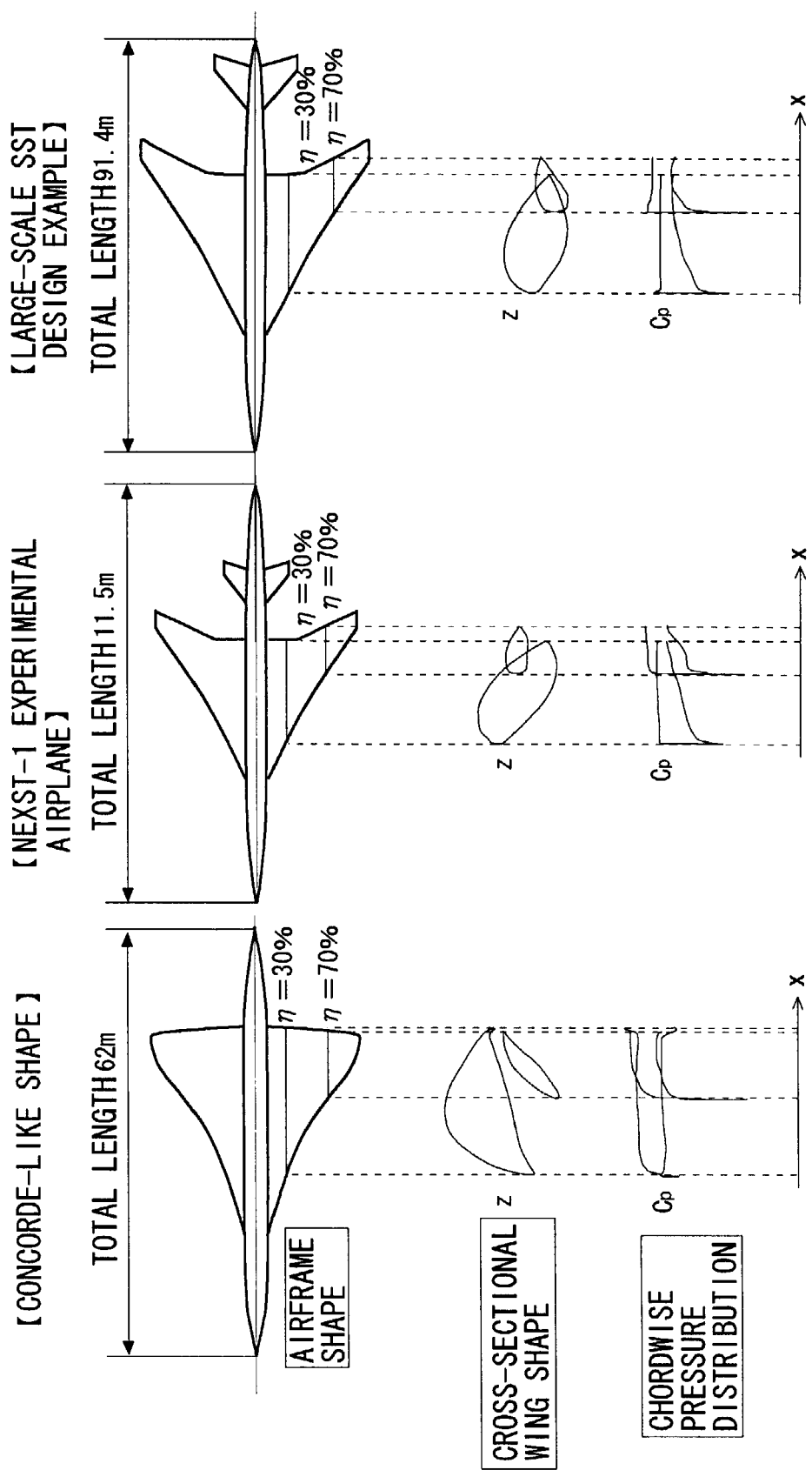
FIG. 7A is an explanatory diagram showing a comparison of wing cross-sectional shapes as examples of a natural laminar flow wing design for a large-scale SST at high-Reynolds number state.
Figure 7B:
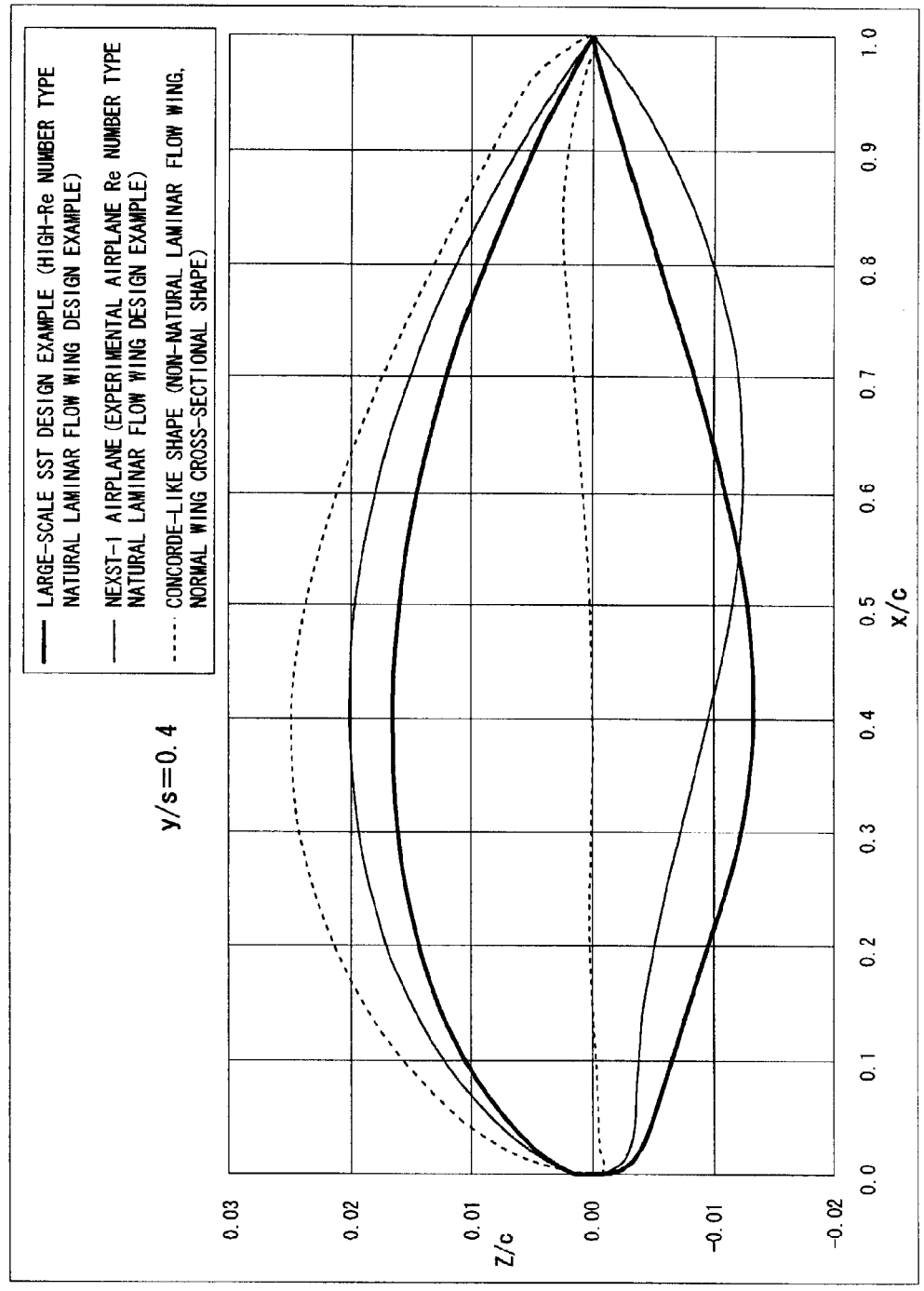
FIG. 7B is an explanatory diagram showing a comparison (overlapping) of wing cross-sectional shapes as examples of natural laminar flow wing designs for a large-scale SST at high-Reynolds number state.
Figure 7C:
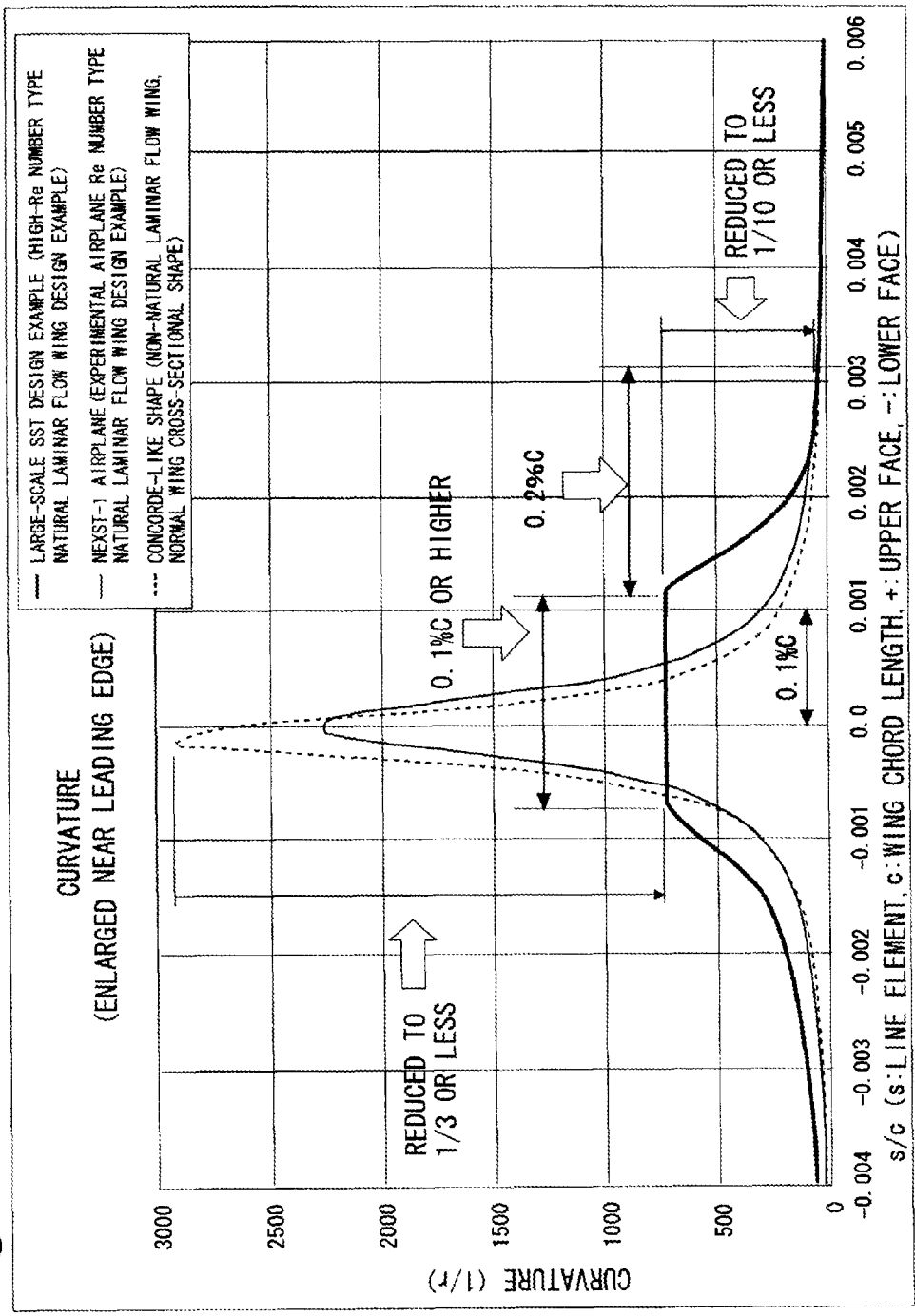
FIG. 7C is an explanatory diagram showing a comparison (overlapping) of the curvature distribution in proximity to the leading edge of cross-sectional wing shapes as examples of a natural laminar flow wing design for a large-scale SST at high-Reynolds number state.
Figure 9:
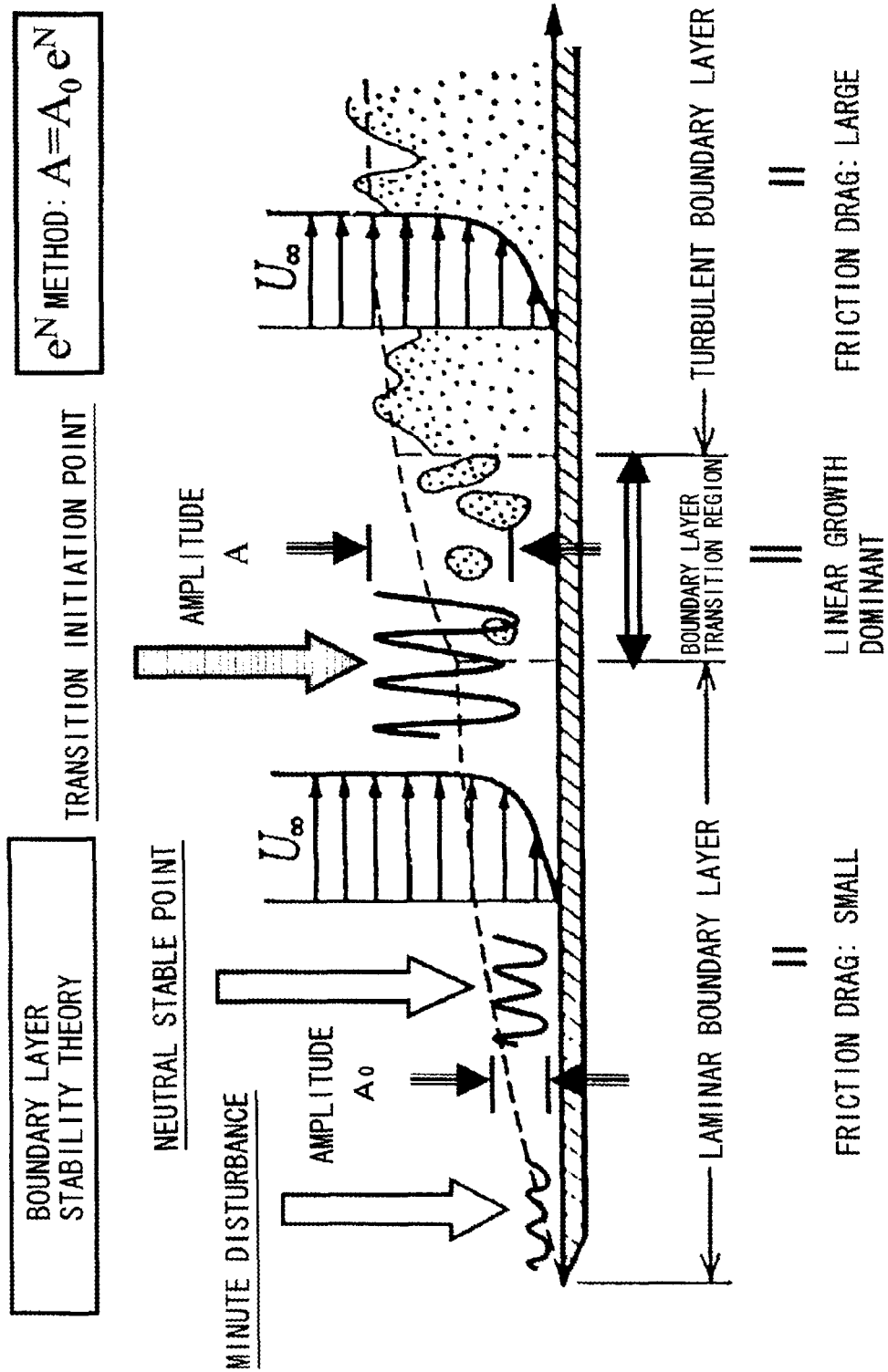
FIG. 9 is an explanatory diagram showing a summary of a transition point prediction technique, as academic background to this invention.

Finally, an example of design of a natural laminar flow wing by a natural laminar flow wing design method of this invention is presented in FIG. 7. FIG. 7A compares the cross-sectional wing shape of a Concorde-like shape (a design shape independently designed by JAXA), considering only pressure drag reduction for a large-scale SST; the natural laminar flow wing shape of the NEXST-1 airplane, corresponding to a Reynolds number of 14 million; and a large-scale SST assumed to be an object for application of this invention (total length 91.4 m-class, wing chord length reference Reynolds number approximately 120 million). FIG. 7B shows three kinds of cross-sectional wing shapes at the 40% semispan station, and FIG. 7C draws in superposition the curvature distributions in proximity to the leading edge (near the stagnation point) of the cross-sectional wing shapes. From the figures it is seen that although curvatures are smaller at higher Reynolds numbers, in wing chord lengths of 0.1% (0.1% c) or greater including the stagnation point (s/2c=0.0), the curvature has a constant value which is ⅓ or less that of the Concorde-like shape, and in the line element region from this line element region (0.1% c or greater) toward the trailing edge over a 0.2% chord length (0.2% c), the curvature has the tendency of further decreasing rapidly to 1/10 or lower. This is thought to depend strongly on the pressure distribution shape in proximity to the leading edge of FIG. 5A. Here "line element(s)" means a line segment from a certain reference point on the outer periphery of the cross-sectional wing shape along the outer periphery in a constant direction. In FIG. 7C, this reference point is defined as the stagnation point, the direction along the upper surface is defined as the positive direction, and the direction along the lower surface is defined as the negative direction.

A natural laminar flow wing design method of this invention can be suitably applied to the design of a natural laminar flow wing at the Reynolds number for which ranges from the 14 million level for a small-scale SST to the 180 million level for a large-scale SST.

What is claimed is:

1. A method for designing a natural laminar flow wing of a supersonic aircraft, comprising:
    a process, performed on a computer, of setting an initial shape of a cross-sectional wing shape;
    a CFD analysis process, performed on the computer, of determining pressure distribution of a flow-field in the vicinity of the cross-sectional wing shape obtained;
    a transition analysis process, performed on the computer, of estimating a boundary layer transition position on a wing surface;
    a process, performed on the computer, of setting target pressure distributions for wing upper and lower surfaces based on the pressure distribution; and
    a CFD-based inverse problem design process, performed on the computer, including the CFD analysis process and a shape correction process correcting the cross-sectional wing shape such that the pressure distribution obtained from the CFD analysis process converges on the target pressure distribution,
    wherein among the target pressure distributions, the wing upper surface target pressure distribution defines a wing chordwise direction from a wing leading edge to a wing trailing edge as a domain at each spanwise station, and moreover is provided by a functional type with parameters dependent on the spanwise station as coefficients,
    wherein a sensitivity of a wing upper surface boundary layer transition due to fluctuations each parameter value of the parameters is analyzed by the transition analysis process,
    wherein an optimal combination of parameter values that delays the wing upper surface boundary layer transition the furthest rearward at a desired Reynolds number is determined by performing a search,
    wherein, when the chordwise direction is an X axis, a spanwise direction is a Y axis, and a wing chord length (=c(y)) is used to make a point in the wing chordwise direction (X) from the wing leading edge at each spanwise station (Y=y) dimensionless ($\zeta \equiv x/c(y)$),
    wherein the shape of the wing upper surface target pressure distribution at each of the spanwise stations is created such that, in an extremely narrow region from the wing leading edge in which $\Delta\zeta<0.01$ is established, a rapid accelerating gradient of pressure and a rapid decelerating gradient are continuous, and in a subsequent broad region in which $\Delta\zeta \leq \zeta \leq 1$ is established, the pressure gently accelerates while simultaneously the acceleration amount is decreased and a gently accelerating gradient asymptotically approaching a predetermined value is continuous, and
    wherein, among the wing upper surface target pressure distribution, for a maximum velocity attainment point of the rapid acceleration gradient at each spanwise station and a constant value of the gentle acceleration gradient, the average values of pressure distributions over predetermined ranges of the wing chord length at the same spanwise stations of an initial pressure distribution obtained by applying the CFD analysis process to the initial shape are set as the initial values of a minimum pressure value and the constant value in the transition analysis process, and then the transition analysis process is executed, and when the boundary layer transition has receded furthest rearward, both values are set as the optimum values thereof.

2. The method for designing a natural laminar flow wing of a supersonic aircraft according to claim 1, wherein, among the target pressure distributions, the wing lower surface target pressure distribution is determined based on the wing upper surface target pressure distribution, and the upper and lower surface pressure difference distribution which realizes the optimal combination of twist angle and camber distribution in the spanwise direction.

3. The method for designing a natural laminar flow wing of a supersonic aircraft according to claim 1, wherein, among the wing upper surface target pressure distribution, the pressure at the wing leading edge at each spanwise station is set to a value obtained by multiplying a stagnation point pressure, determined by a free-stream Mach number and a leading edge sweep angle of the wing, by a constant value.

4. The method for designing a natural laminar flow wing of a supersonic aircraft according to claim 1, wherein, when each spanwise station (Y=y) is rendered dimensionless ($\eta \equiv y/s$) by a semi-span(s),
    the wing upper surface target pressure distribution ($Cp(\zeta, \eta)$) is defined by the following exponential function having as coefficients parameters $\{A_0(\eta), A_2(\eta), A_2(\eta), A_3(\eta), A_4(\eta), B_1(\eta), B_2(\eta), B_3(\eta)\}$ dependent on each spanwise station and parameters $\{P_1, P_2\}$ not dependent the same, $$Cp(\zeta,\eta)=A_0(\eta)\cdot 1+A_1(\eta)\cdot[\exp(B_1(\eta)\zeta)-1]+A_2(\eta)\cdot[\exp(B_2(\eta)\zeta)-1]+A_3(\eta)\cdot[\exp(B_3(\eta)\zeta^{P_1})-1]+A_4(\eta)\cdot\zeta^{P_2},$$

the sensitivity of the wing upper surface boundary layer transition due to fluctuations of each of parameter values of the parameters is analyzed by the transition analysis process, and a search is performed for an optimal combination of parameter values that delay the wing upper surface boundary layer transition the furthest rearward at a desired Reynolds number.

5. A wing for a supersonic aircraft, having a design designed using the method for designing a natural laminar flow wing of a supersonic aircraft according to claim 1, wherein a cross-sectional wing shape along a wing chordwise direction at each spanwise station is configured such that a curvature in proximity to a leading edge has a predetermined value of ⅓ or less compared with a normal cross-sectional wing shape in a line element region of 0.1% of a wing chord length or greater including the leading edge, and such that the curvature in the line element of 0.2% of the wing chord length from the line element region toward a trailing edge further decreases rapidly to 1/10 or less than the predetermined value.

6. The method for designing a natural laminar flow wing of a supersonic aircraft according to claim 2, wherein, when the chordwise direction is an X axis, the spanwise direction is a Y axis, and a wing chord length (=c(y)) is used to make a point in the wing chordwise direction (X) from the wing leading edge at each spanwise station (Y=y) dimensionless ($\zeta \equiv x/c(y)$), the shape of the wing upper surface target pressure distribution at each of the spanwise stations is created such that, in an extremely narrow region from the wing leading edge in which $\Delta\zeta<0.01$ is established, a rapid accelerating gradient of pressure and a rapid decelerating gradient are continuous, and in a subsequent broad region in which $\Delta\zeta \leq \zeta \leq 1$ is established, the pressure gently accelerates while simultaneously the acceleration amount is decreased and a gently accelerating gradient asymptotically approaching a predetermined value is continuous.

7. A wing for a supersonic aircraft, having a design designed using the method for designing a natural laminar flow wing of a supersonic aircraft according to claim 2, wherein a cross-sectional wing shape along a wing chordwise direction at each spanwise station is configured such that a curvature in proximity to a leading edge has a predetermined value of ⅓ or less compared with a normal cross-sectional wing shape in a line element region of 0.1% of a wing chord length or greater including the leading edge, and such that the curvature in the line element of 0.2% of the wing chord length from the line element region toward a trailing edge further decreases rapidly to ⅒ or less than the predetermined value.

8. A wing for a supersonic aircraft, having a design designed using the method for designing a natural laminar flow wing of a supersonic aircraft according to claim 3, wherein a cross-sectional wing shape along a wing chordwise direction at each spanwise station is configured such that a curvature in proximity to a leading edge has a predetermined value of ⅓ or less compared with a normal cross-sectional wing shape in a line element region of 0.1% of a wing chord length or greater including the leading edge, and such that the curvature in the line element of 0.2% of the wing chord length from the line element region toward a trailing edge further decreases rapidly to ⅒ or less than the predetermined value.

9. A wing for a supersonic aircraft, having a design designed using the method for designing a natural laminar flow wing of a supersonic aircraft according to claim 4, wherein a cross-sectional wing shape along a wing chordwise direction at each spanwise station is configured such that a curvature in proximity to a leading edge has a predetermined value of ⅓ or less compared with a normal cross-sectional wing shape in a line element region of 0.1% of a wing chord length or greater including the leading edge, and such that the curvature in the line element of 0.2% of the wing chord length from the line element region toward a trailing edge further decreases rapidly to ⅒ or less than the predetermined value.

* * * * *